United States Patent
Blank et al.

(10) Patent No.: US 9,194,922 B2
(45) Date of Patent: Nov. 24, 2015

(54) SYSTEM AND METHOD FOR ELECTRON SPIN RESONANCE

(75) Inventors: Aharon Blank, Kfar-Vradim (IL); Ygal Twig, Petach-Tikva (IL)

(73) Assignee: Technion Research & Development Foundation Limited, Haifa (IL)

(*) Notice: Subject to any disclaimer, the term of this patent is extended or adjusted under 35 U.S.C. 154(b) by 961 days.

(21) Appl. No.: 13/275,504

(22) Filed: Oct. 18, 2011

(65) Prior Publication Data

US 2013/0093424 A1   Apr. 18, 2013

(51) Int. Cl.
*G01R 33/28* (2006.01)
*G01R 33/60* (2006.01)
*G01R 33/341* (2006.01)
*G01R 33/34* (2006.01)

(52) U.S. Cl.
CPC .............. *G01R 33/341* (2013.01); *G01R 33/60* (2013.01); *G01R 33/34007* (2013.01)

(58) Field of Classification Search
CPC .... G01R 33/343; G01R 33/345; G01R 33/60; G01R 33/34007; G01R 33/341
USPC ................................................. 324/300–322
See application file for complete search history.

(56) References Cited

U.S. PATENT DOCUMENTS

| | | | | |
|---|---|---|---|---|
| 6,538,454 | B1* | 3/2003 | Frenkel et al. | 324/637 |
| 7,403,008 | B2* | 7/2008 | Blank et al. | 324/316 |
| 2007/0159175 | A1* | 7/2007 | Prins | 324/322 |
| 2010/0001728 | A1* | 1/2010 | Blank et al. | 324/316 |

OTHER PUBLICATIONS

Twig, Ygal, Ekaterina Suhovoy, and Aharon Blank. "Sensitive surface loop-gap microresonators for electron spin resonance." Review of Scientific Instruments 81.10 (2010): 104703.*
Blank et al. "ESR Imaging in Solid Phase Down to Sub-Micron Resolution: Methodology and Applications", Physical Chemistry Chemical Physics, 11: 6689-6699, 2009.
Borbat et al. "Electron Spin Resonance in Studies of Membranes and Proteins", Science, 291(5502): 266-269, Jan. 12, 2001.
Kuhns "Inductive Coupling and Tuning in NMR Probes; Applications", Journal of Magnetic Resonance, 78: 69-76, 1988.
Lips et al. "Defects and Rcombination in Microcrystalline Silicon", Solar Energy Materials & Solar Cells, 78: 513-541, 2003.
Mannini et al. "Patterned Monolayers of Nitronyl Nitroxide Radicals", Inorganica Chimica Acta, 361: 3525-3528, 2008.
Narkowicz et al. "Planar Microresonators for EPR Experiments", Journal of Magnetic Resonance, JMR, 175: 275-284, 2005.
Narkowicz et al. "Scaling of Sensitivity and Efficiency in Planar Microresonators for Electron Spin Resonance", Review of Scientific Instruments, 79: 084702-1-084702-8, 2008.
Wago et al. "Force-Detected Electron-Spin Resonance: Adiabatic Inversion, Nutation, and Spin Echo", Physical Review B, 57(2): 1108-1114, Jan. 1, 1998.
Torreszan et al. "Microstrip Resonators for Electron Paramagnetic Resonance Experiments", The Review of Scientific Instruments, 80(7): 075111-1-075111-15, Jul. 2009.

* cited by examiner

*Primary Examiner* — Melissa Koval
*Assistant Examiner* — Rishi Patel

(57) ABSTRACT

A resonator system for electron spin resonance (ESR) is disclosed. The resonator system comprises: a generally planar resonator layer defining an open-loop gapped by a non-conductive gap in the layer, and a microwave feed, positioned configured for transmitting microwave to the resonator layer such as to concentrate, with a quality factor of at least 100, a magnetic field within an effective volume of less than 1 nL above the layer.

30 Claims, 21 Drawing Sheets

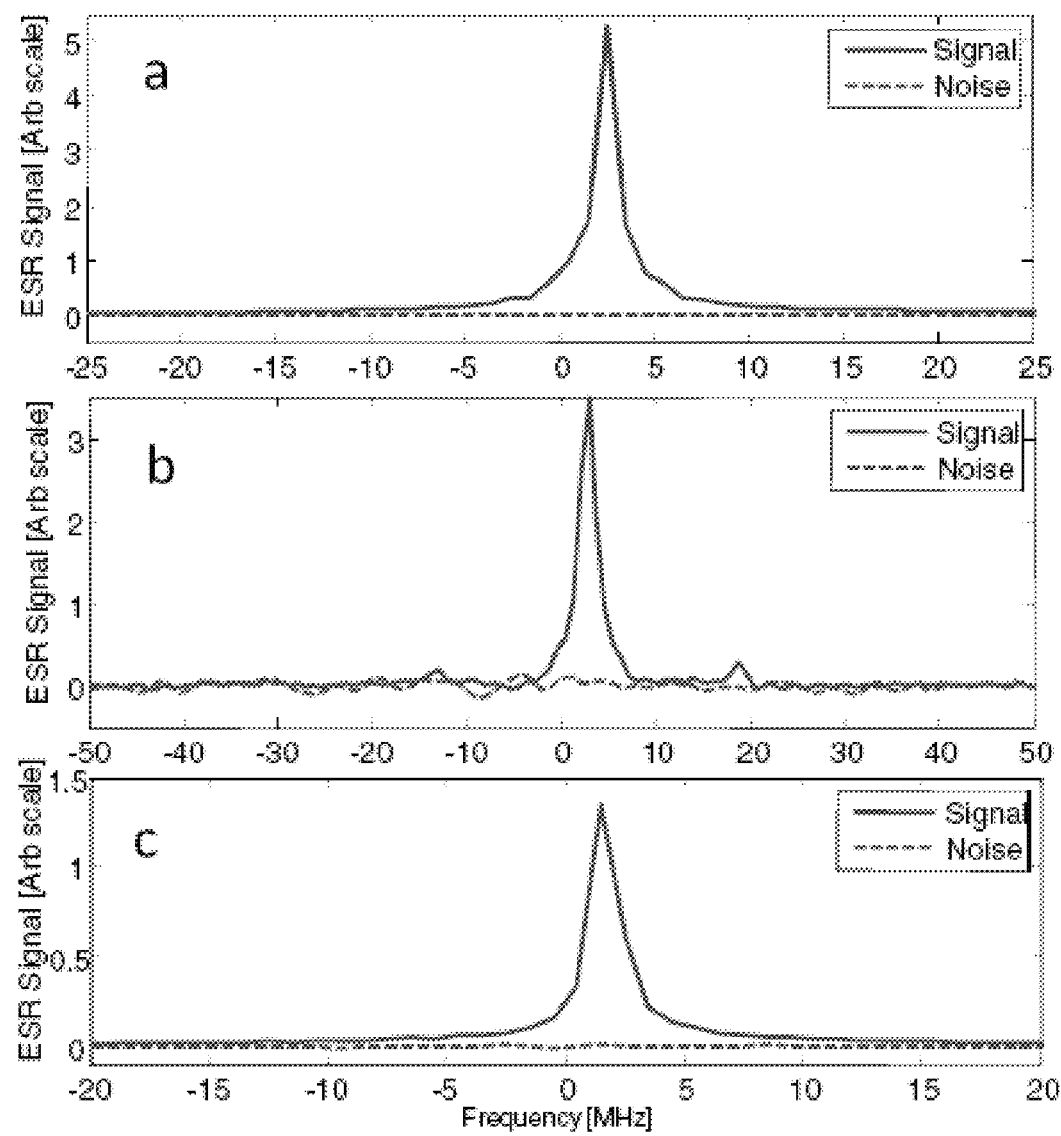
FIGs. 13A-C

SYSTEM AND METHOD FOR ELECTRON SPIN RESONANCE

FIELD AND BACKGROUND OF THE INVENTION

The present invention, in some embodiments thereof, relates to electron spin resonance and, more particularly, but not exclusively, to a resonator suitable for electron spin resonance.

Electron spin resonance (ESR) imaging is a technique for obtaining spatially resolved ESR-based data from samples. ESR-based data is obtained by applying on the sample a static magnetic field, exciting electron spins in the sample by electromagnetic waves, and detecting irradiation created by the electron spins as a result of their excitation.

The spatially resolved ESR-based data can, for example, provide information about chemical structure, elucidate biological functions, enable non-invasive medical diagnosis, and be used to solve material science problems.

In classical ESR detection method, termed "induction detection", the imaged specimen is placed inside a microwave resonator, and is subjected to a static magnetic field and to microwave radiation. Within the framework of "induction detection", there are two possible schemes to obtain the ESR-based data, pulsed and continuous wave ESR. In pulsed ESR, a specific set of microwave pulses are induced upon the sample and after a short while the spins in the sample create microwave radiation of their own, termed "echo", which is detected by the resonator and analyzed. In continuous wave (CW) ESR, the sample is irradiated with a continuous microwave irradiation, and the ESR signal is detected by monitoring the microwave signal reflected from the resonator as a function of the static magnetic field.

Spatial information on the location of the spins that create the ESR signal is obtained through the linear dependence of the frequency of the ESR signal on the intensity of the magnetic field. Specifically, a combination of static and time varying magnetic field gradients are applied across the specimen, such that each point in the specimen is exposed to a magnetic field with different intensity at different times. This way, spins from each point irradiate in a different frequency or with different phase, and the frequency or phase is used to determine the location of the spins that created the signal.

The magnetic field gradients are usually applied with gradient coils. The stronger is the gradient provided by the gradient coils, the better is the spatial resolution of the obtained ESR image.

An imaging device, designed to image a specimen when the specimen is inside the imaging device, is said to have "in-situ geometry". An imaging device, designed to image a specimen when the specimen is outside the imaging device is said to have "ex-situ geometry". In the context of induction ESR, a specimen is said to be inside the imaging device if it is inside the smallest convex volume that includes the resonator, the gradient coils, and the static magnetic field source.

U.S. Pat. No. 7,403,008, wherein one of the present inventors is a co-inventor, describes a room-temperature in-situ ESR imaging probe, for biological applications, having a resolution of the order of $(1\ \mu m)^3$.

U.S. Published Application No. 20100001728, own by the same assignee as the present application and being hereby incorporated by reference, discloses an ESR imaging probe which comprises a microwave feed and a resonator. The microwave feed transmits microwave energy to the resonator, and the resonator concentrates ESR signals generated and acquires a signal from 1000 electron spins or less within one hour. The ESR signals are sent to a processor for generating an image of a region of interest outside the resonator.

Additional background art includes International Publication Nos. WO2005/073695 and WO02/21147.

SUMMARY OF THE INVENTION

According to an aspect of some embodiments of the present invention there is provided a resonator system for electron spin resonance (ESR). The resonator system comprises: a generally planar resonator layer having a thickness of less than 1 micron deposited on a dielectric substrate, the resonator layer defining an open-loop gapped by a non-conductive gap in the layer; and a microwave feed, positioned opposite to the resonator layer relative to the substrate and configured for transmitting microwave to the resonator layer to concentrate a microwave magnetic field within an effective volume above the layer.

According to some embodiments of the invention the effective volume is less than 1 nL and the system is characterized by a quality factor of at least 10 or at least 100 or at least 1,000 or at least 5,000, e.g., 10,000 or more.

According to an aspect of some embodiments of the present invention there is provided a resonator system for electron spin resonance (ESR). The resonator system comprises a generally planar resonator layer and a microwave feed configured for transmitting microwave to the resonator layer, such as to concentrate, with a quality factor of at least 100, a magnetic field within an effective volume of less than 1 nL above the layer.

According to some embodiments of the invention the system further comprises a distance adjusting unit configured for adjusting a distance between the microwave feed and the resonator layer.

According to an aspect of some embodiments of the present invention there is provided a resonator system for electron spin resonance (ESR). The resonator system comprises a generally planar resonator layer, a microwave feed and a distance adjusting unit configured for adjusting a distance between the microwave feed and the resonator layer.

According to some embodiments of the invention the gap has an elongated shape defining a longitudinal axis generally parallel to the layer.

According to some embodiments of the invention the substrate has an anisotropic crystal structure and wherein a c-axis of the crystal structure is generally parallel to the layer and generally perpendicular to the longitudinal axis.

According to some embodiments of the invention the substrate has an anisotropic crystal structure and wherein a c-axis of the crystal structure is generally parallel to the layer and generally parallel to the longitudinal axis.

According to some embodiments of the invention the resonator layer has a shape of a disc and wherein the gap is extending along a radial direction of the disc.

According to some embodiments of the invention the gap comprises a generally round portion at a center of the disc.

According to some embodiments of the invention the resonator layer has an elongated shape defining a longitudinal axis and wherein the gap is extending along the longitudinal axis.

According to some embodiments of the invention the elongated shape and the gap generally define a U shape.

According to some embodiments of the invention the gap widens towards a periphery of the resonator layer.

According to some embodiments of the invention the gap has a generally fixed width along the longitudinal axis.

According to some embodiments of the invention the gap comprises a fixed width part and a widening part.

According to some embodiments of the invention the widening part is an extension of the fixed width.

According to some embodiments of the invention the microwave feed comprises an elongated antenna generally parallel to the longitudinal axis.

According to some embodiments of the invention the antenna is generally planar.

According to some embodiments of the invention the antenna has at least one gap near an end of the antenna and generally perpendicular to the longitudinal axis.

According to some embodiments of the invention the at least one gap of the antenna forms an interdigitated pattern.

According to some embodiments of the invention the resonance system is characterized by spin sensitivity of less than $2\times10^7$ spins/$\sqrt{Hz}$ in a LiPc sample for 1 second of acquisition at a frequency of about 15 GHz and room temperature.

According to some embodiments of the invention the resonance system is characterized by spin sensitivity of less than $2\times10^8$ spins/$\sqrt{Hz}$ in a SiO2 sample for 1 second of acquisition at a frequency of about 15 GHz and room temperature.

According to some embodiments of the invention the resonance system is characterized by spin sensitivity of less than $2\times10^6$ spins/$\sqrt{Hz}$ in a sample of phosphorus doped $^{28}$Si, at a frequency of about 14 GHz and temperature of about 10 K.

According to an aspect of some embodiments of the present invention there is provided an ESR system. The system comprises a resonator system according to any of the above embodiments or combination thereof, a controller for activating the resonator system to induce ESR signals within a sample and to receive the signal, and a data processor configured for receiving from the controller an input indicative of the ESR signals, and providing ESR analysis responsively to the signals.

According to some embodiments of the invention the system further comprises at least one gradient coil configured for spatially encoding the ESR signals from the sample.

According to some embodiments of the invention the data processor is configured for generating an image of the sample based on the ESR signals.

According to an aspect of some embodiments of the present invention there is provided a method of inducing an electron spin resonance (ESR) signal. The method comprises: using a microwave feed for transmitting microwave to a generally planar resonator layer having a thickness of less than 1 micron and defining an open-loop gapped by a non-conductive gap in the layer, such as to concentrate, with a quality factor of at least 100, a magnetic field within an effective volume of less than 1 nL in a sample above the layer.

According to some embodiments of the invention the method further comprises receiving the signal using the resonator layer, and performing ESR analysis responsively to the signal.

According to some embodiments of the invention the ESR analysis comprises imaging.

According to some embodiments of the invention the sample is selected from the group consisting of a surface or sub-surface of a semiconductor structure, a paramagnetic monolayer, a biological sample, and a spin-limited sample.

According to some embodiments of the invention the method comprises varying a distance between the microwave feed and the resonator layer.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 13A-C show ESR signal (solid line) and noise (dashed line) in the frequency domain for a trityl solution sample (FIG. 13A), $C_{60}:N@C_{60}$ sample (FIG. 13B), and a $^{28}$Si:P sample (FIG. 13C), as obtained in experiments performed according to some embodiments of the present invention using a resonator system illustrated in FIG. 2C;

DESCRIPTION OF SPECIFIC EMBODIMENTS OF THE INVENTION

Figure 1A:
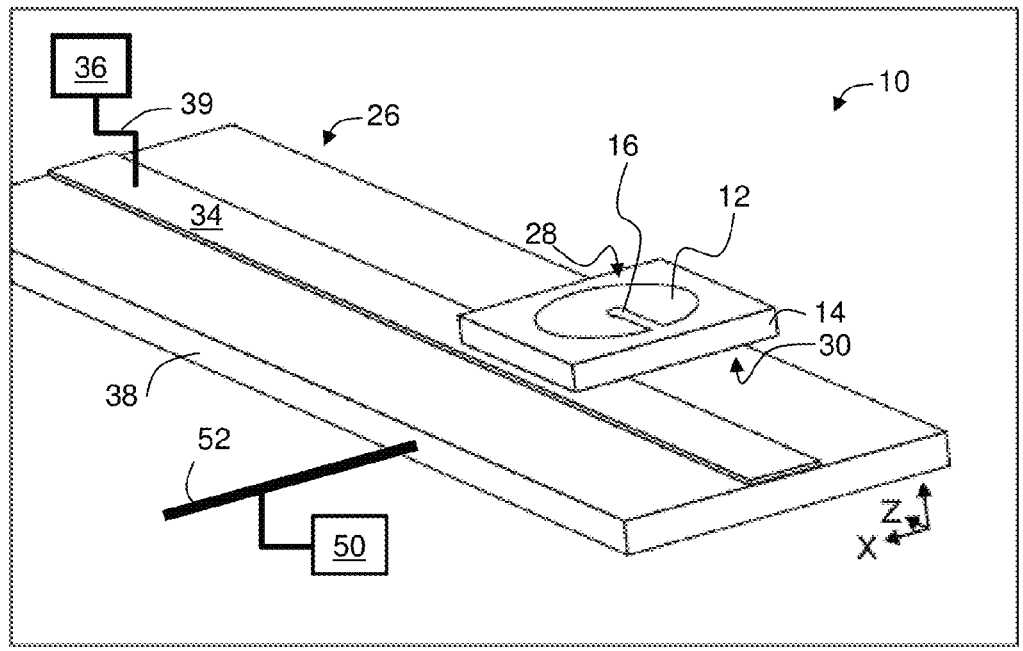
FIGS. 1A-C are schematic illustrations of a resonator system according to some embodiments of the present invention.

The present invention, in some embodiments thereof, relates to electron spin resonance and, more particularly, but not exclusively, to a resonator suitable for electron spin resonance.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present embodiments comprise a resonator system for ESR, which resonator system is particularly useful for induction-detection ESR. In some embodiments of the present invention the resonator system is utilized for ex-situ ESR analysis (e.g., by incorporating the resonator system in an ex-situ ESR system), and in some embodiments of the present invention the resonator system is utilized for in-situ ESR analysis (e.g., by incorporating the resonator system in an in-situ ESR system). The resonator system of the present embodiments is particularly useful for induction-detection ESR.

In various exemplary embodiments of the invention the resonator system comprises a generally planar resonator layer and a microwave feed. The microwave feed transmits microwave to resonator layer and the resonator layer concentrates a magnetic field above the layer within an effective volume of less than 1 nL or less than 0.1 nL e.g., about 0.01 nL or less, when operating at a frequency of from about 10 GHz to about 35 GHz. In various exemplary embodiments of the invention the materials and/or operating temperature of the resonator system are selected such that the characteristic quality factor of the resonator system is of at least 10, 100, or at least 200 or at least 500 or at least 1,000 or at least 5,000, e.g., 10,000 or more.

As used herein, "effective volume" refers to a volume calculated by dividing a small arbitrary volume $V_v$ (e.g., 1 μm$^3$), at the center of the resonator, by its filling factor.

A filling factor of a particular volume (e.g., a volume $V_v$) is defined as the ratio between the integral of the square of the magnetic field over the particular volume divided and the integral of the square of the magnetic field over the entire resonator and its coupling volume.

As used herein, "coupling volume" refers to a volume within which the magnetic field generated by the resonator system is no less than 1% of the maximum value of the magnetic field.

This definition is in line with the definition found in the literature (see, e.g., a book by C. P. Poole, entitled "Electron Spin Resonance: A Comprehensive Treatise on Experimental Techniques," Wiley, New York, 1983).

As used herein, "quality factor" refers to the ratio between the resonance frequency and the width of the frequency curve which is centered at that the resonance frequency.

Before providing a further detailed description of the resonator system of the present embodiments as delineated hereinabove, attention will be given to the advantages and potential applications offered thereby.

Conventional resonator systems for ESR at at about 14 GHz have an effective volume which is typically 10-30 nL (see Narkowicz et al., 2008). Thus, the resonator system of the present embodiments is characterized by an effective volume which is smaller than the effective volumes of known systems by at least one order of magnitude. The system of the present embodiments has a small effective volume but still maintains a sufficient quality factor. The advantage of having small effective volume and sufficient quality factor is that it increases the spin sensitivity and spatial and spectral resolution of the system.

In experiments performed by the present inventors, spin sensitivity of less than $2\times10^7$ spins/√Hz for 1 second of acquisition has been achieved in a LiPc sample at a frequency of about 15 GHz and room temperature, spin sensitivity of less than $2\times10^8$ spins/√Hz for one second of acquisition has been achieved in a SiO$_2$ sample at a frequency of about 15 GHz and room temperature, and spin sensitivity of less than $2\times10^6$ spins/√Hz for 1 second of acquisition has been achieved in for a sample of phosphorus doped $^{28}$Si, at a frequency of about 14 GHz and temperature of 10 K.

Another advantage of the system of the present embodiments is that it provides a sufficiently high microwave field-power conversion ratio. In experiments performed by the present inventors, it was found that the conversion ratio can be more than 50 Gauss/√Watt of input microwave power or more than 60 Gauss/√Watt or more than 70 Gauss/√Watt or more than 80 Gauss/√Hz. High conversion ratio is particularly useful for applications in which pulsed excitations are employed, since it allows using short excitation pulses with relatively low microwave power.

An additional advantage of the resonator system of the present embodiments is that it allows placing gradient coils at very close proximity to the sample, thereby increasing the image resolution, particularly in ESR micro and nano-scale imaging applications.

The system of the present embodiments can be used in various fields including, without limitation, physics, biology, medicine and materials science. The system of the present embodiments can be used in various applications, including, without limitation, the study of free radicals, crystal defects and transient paramagnetic species. More specifically, the system of the present embodiments can be used for detection and imaging of defects on the surface and sub-surface of semiconductors e.g., polycrystalline silicon for solar-cell applications; measurements of paramagnetic monolayers; inspection of small biological systems, such as single cells internalized by stable radicals or paramagnetic labeled membranes; and performing ESR spectroscopic measurements on spin-limited samples (e.g., samples with less than about 10,000 or less than about 1,000 spins. The system of the present embodiments can be also used in electron nuclear double resonance (ENDOR) measurements of samples that are hard to obtain in large quantities or hard to crystallize (providing increased spectral resolution in the latter case).

Figure 1B:
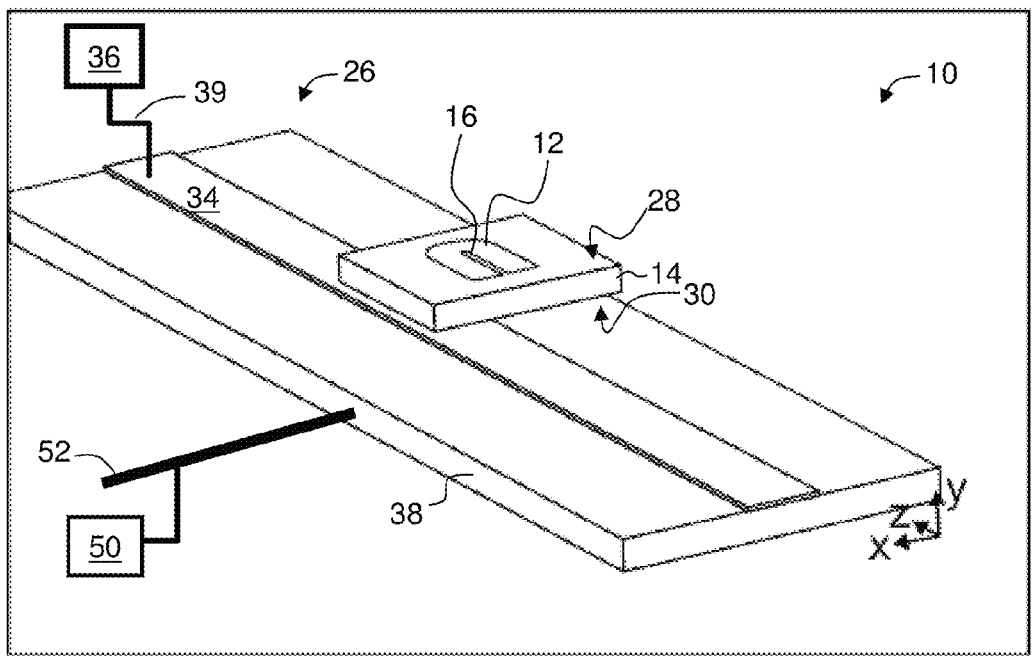
Figure 1C:
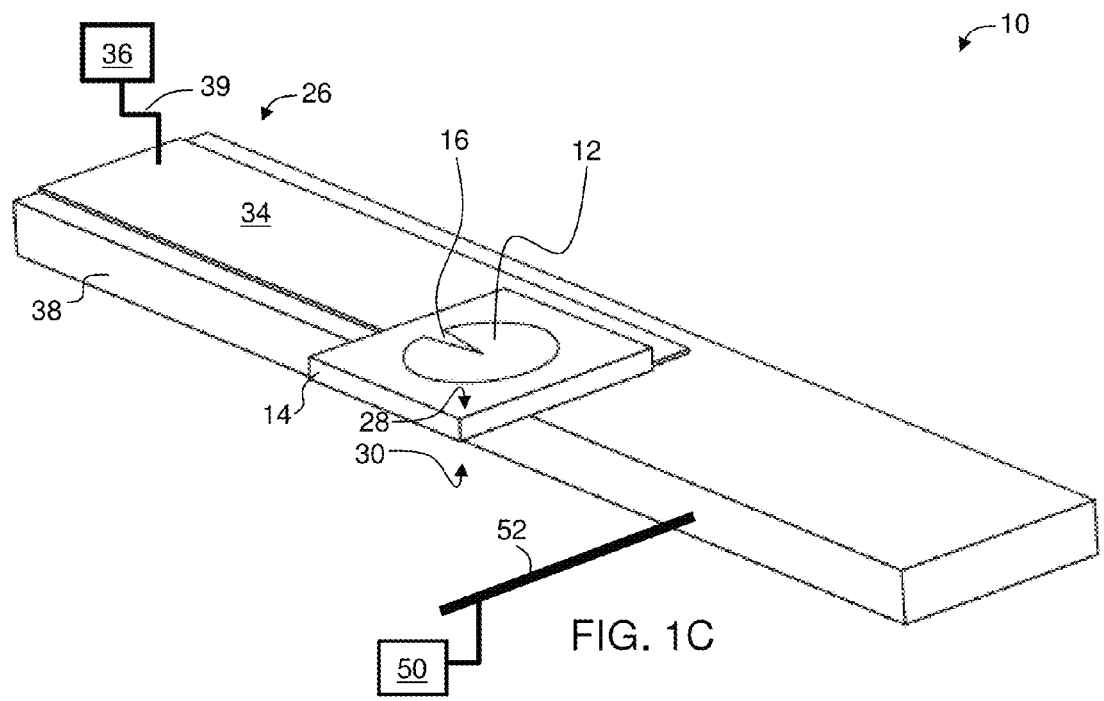

Some preferred configurations for a resonator system 10 according to some embodiments of the present invention are illustrated in FIGS. 1A-C. System 10 is particularly useful for induction-detection ESR, and it can be utilized for both ex-situ and in-situ ESR. Resonator system 10 comprises a generally planar resonator layer 12 deposited on a dielectric substrate 14. The thickness of resonator layer 12 is preferably less than 1 micron or less than 0.8 micron or less than 0.6 micron or less than 0.4 micron, e.g., 0.3 micron or less. Layer 12 can be made of any conductor or superconductor material. Representative examples of conductor materials suitable for layer 12 including, without limitation, metals such as gold, copper, platinum, aluminum, silver and the like. Preferred metals include gold and copper. Representative examples of superconductor materials suitable for the present embodiments include, without limitation, yttrium-barium-copper-oxygen (YBCO), and neodymium nitride (NdN).

In various exemplary embodiments of the invention resonator layer 12 defines an open-loop gapped by a non-conductive gap. The gap in layer 12 is generally shown at 16.

Figure 2A:
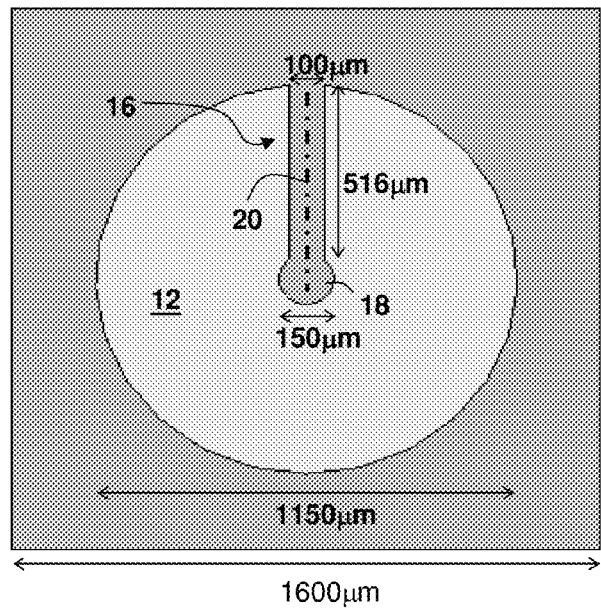
FIGS. 2A-D are schematic illustrations of shapes suitable for a resonator layer and gap, according to some embodiments of the present invention.
Figure 2B:
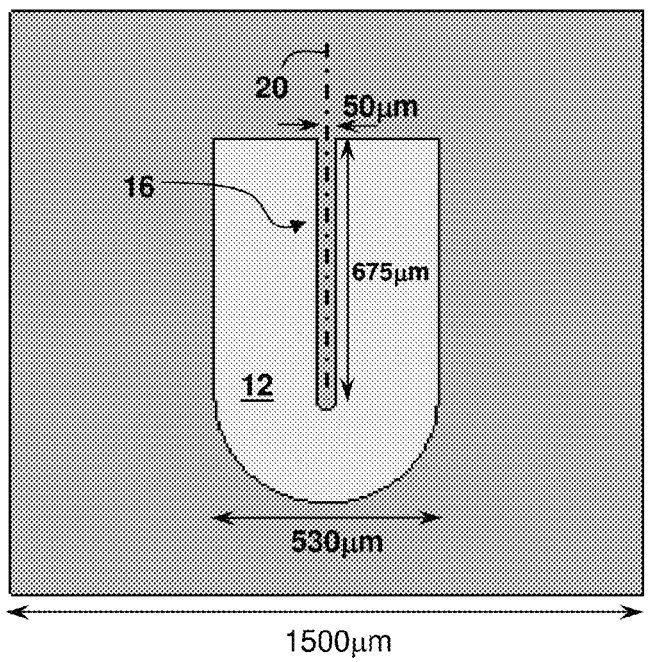
Figure 2C:
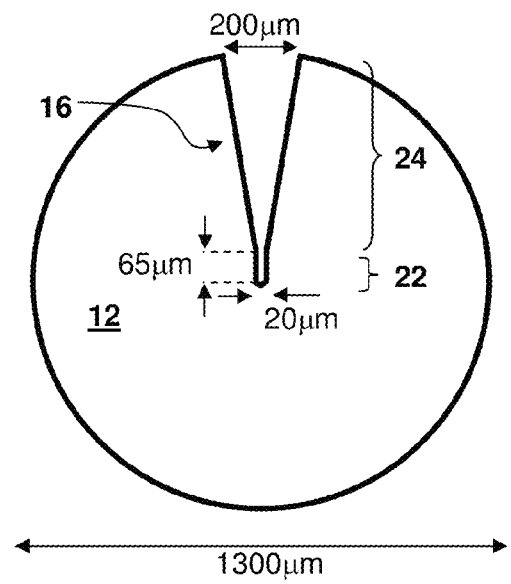

Layer 12 and gap 16 can have many shapes. Some shapes, which are suitable for the present embodiments, are illustrated in FIGS. 2A-D. It is to be understood that the dimensions shown on FIGS. 2A-C are exemplary dimensions which may be employed in some embodiments of the present invention but are not to be considered as limiting the scope of the present invention in any way.

Figure 2D:
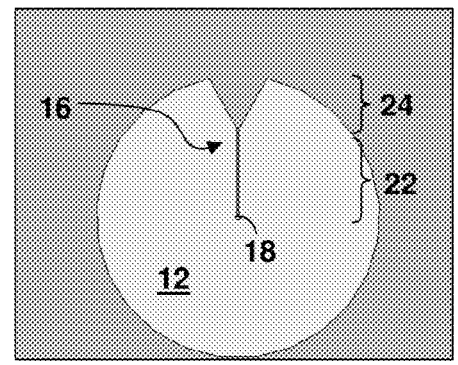

As shown in FIGS. 2A-D, gap 16 can have an elongated shape defining a longitudinal axis 20 generally parallel to layer 12. For clarity of presentation, the axis 20 is shown only on FIGS. 2A and 2B. Gap 16 can have a generally fixed width along longitudinal axis 20, as illustrated in FIG. 2B which shows an exemplified configuration in which gap 16 has a U shape. In other embodiments, gap 16 widens towards the periphery of resonator layer 12. These embodiments are illustrated in FIGS. 2C and 2D which show exemplified configurations in which gap 16 has a fixed width part 22 and a widening part 24. The widening part can have generally straight legs (e.g., forming a V-shape) or arced legs (e.g., outwardly concaved legs forming the shape of a horn). In various exemplary embodiments of the invention the widening part 24 is an extension of fixed width 22 (e.g., forming a Y shape or the like).

In some embodiments of the present invention resonator layer 12 has a shape of a disc, wherein gap 16 is extending along a radial direction of disc. These embodiments are schematically illustrated in FIGS. 2A, 2C and 2D (only a partial view is illustrated in FIG. 2D). Gap 16 preferably extends from the center of the disc to the periphery of the disc. Gap 16 can also have, in some embodiments, a generally round portion 18 at a center of disc.

In other embodiments, resonator layer 12 has an elongated shape which defines longitudinal axis 20, wherein gap 16 also extends along the same longitudinal axis. The elongated shape can be in the form example an oval or an ellipse or part thereof. A representative and non limiting example of such shape is illustrated in FIG. 2B, showing a part of an oval forming, together with gap 16, a U shape.

The width and/or length of layer 12 are from about 0.1 mm to about 5 mm depending on the shape. For example, when layer 12 is shaped as a disc, both width and length are equal and define the diameter of the disc, and when layer 12 is elongated, the width is shorter than the length. A typical aspect ratio (length to width) of an elongated layer 12 is from about 2 to about 5 Also contemplated are embodiments in which the width and/or length of layer 12 are from about 0.1 mm to about 3 mm or from about 0.1 mm to about 2 mm.

Substrate 14, on which layer 12 is deposited, can be made of any dielectric material. Preferably, the dielectric material is of high permittivity, e.g., at least 80 or at least 100 or at least 120, at least 140 or at least 150 or at least 160. The dielectric material of substrate 14 optionally and preferably has an anisotropic crystal structure. A representative example for a dielectric material suitable for the present embodiments is metal oxide, e.g., titanium oxide or zinc oxide or $SrTiO_3$ or $CaTiO_3$, or $LaAlO_3$. The present Inventors contemplate any relative orientation between the longitudinal axis 20 of gap 16 and the c-axis of the anisotropic crystal structure. In some embodiments of the present invention longitudinal axis 20 is parallel to the c-axis. In other embodiments, longitudinal axis 20 is generally perpendicular to the c-axis.

The term "c-axis" is known in the art and refers to a crystallographic direction in which the axial direction and its opposite are nonequivalent in the crystallographic sense (see, for example, Crystals and Light, Elizabeth A. Wood, D. Van Nostrand Co., Inc., Princeton, N.J. 1964).

The thickness of substrate 14 can be much larger than the thickness of layer 12. A typical thickness of substrate 14 is 100-300 microns.

In various exemplary embodiments of the invention system 10 comprises a microwave feed 26, positioned opposite to resonator layer 12 relative to substrate 14. In other words, substrate 14 is between resonator layer 12 and microwave feed 26. Thus, for example, substrate 14 may have a front side 28 and a back side 30 opposite to front side 28, wherein resonator layer 12 is deposited on front side 28 and microwave feed 26 is at or near back side 30.

The present inventors found that it is advantageous to have the microwave feed 26 and resonator layer 12 at opposite sides of substrate 14 since this allows better control on the coupling between feed 26 and layer 12 and allows placing the sample on or close to the resonator without interference from a transmission line. The present inventors found that in conventional ESR surface resonators it is not possible to have the microwave feed and resonator at opposite sides since in conventional surface resonators the back side of the substrate has to be grounded.

In use, microwave feed 26 transmits electromagnetic radiation in the microwave domain to resonator layer 12, and resonator layer 12 concentrates a microwave magnetic field within an effective volume (not shown) above layer 12.

As used herein "above layer 12" refers to a location in proximity to layer 12 which is further away from substrate 14 with respect to microwave feed 26. In the above notations of front and back sides, the location at which the microwave magnetic field is concentrated by layer 12 is near front side 28 and farther from backside 30. The effective volume and/or characteristic quality factor can have any of the values listed hereinabove.

Thus, resonator layer 12 concentrates the magnetic field of the transmitted microwave to excite the spins and also concentrates the ESR signal created by the spins back to feed 26 when the spins irradiate. The effect of field concentration is strong enough such that the intensity of the alternating magnetic field above layer 12, for instance is good enough to obtain ESR signals in a sample placed in an imaging or spectroscopic proximity to resonator layer 12. Imaging or spectroscopic proximity, in this context, is a distance of between about 1 and about 10, 100, or 200 µm with shorter distances allowing higher resolution. The ESR signals are optionally and preferably strong enough and have high enough signal-to-noise-ratio (SNR) to be used for obtaining spectroscopy signals or creating an image of the sample portion.

The coupling between feed 26 and resonator layer 12 is optionally via the electric field component of the microwave radiation. Microwave feed 26 is preferably configured to feed microwave around the resonance frequency of the resonator, which is typically between about 10 GHz and about 60 GHz.

The microwave feed is connected to a transceiver 36, which transmits microwave for exciting the electron spins in the sample, and receives the signal from the spins. Transceiver 36 can be part of a microwave bridge (not shown, see FIG. 16) which may further include a block converter, such as but not limited to, a Q band block converter, as known in the art.

The microwave feed can be operated in CW or pulse mode, as desired.

Preferably, microwave feed 26 comprises a transmission line, schematically shown at 39, for example, waveguide, or coaxial cable. Optionally, the microwave feed is an output of a microwave bridge module (not shown, see FIG. 4). For example, when the transmission line is a coaxial line the microwave feed can be a generally planar antenna 34, such as an open microstrip line or the like, going from the central conductor of a coaxial cable. In case of a waveguide transmission line, the antenna or microstrip line can extend out of the waveguide.

Antenna 34 can engage a plane which is generally parallel to layer 12. For example, antenna 34 can be deposited on a second substrate 38 positioned opposite to layer 12 such that substrate 14 is between layer 12 and substrate 38. Preferably, antenna is deposited on the surface of substrate 38 which faces substrate 14. Substrate 38 is optionally and preferably coated on the opposite side with a ground layer, as know in the art. Antenna 34 may or may not contact substrate 14.

The section of antenna 34 that is close to the resonator layer can have an elongate shape, which can be a plain shape, such as a rectangle, or an oval, or an elongated triangular, or it can be a patterned shape. A patterned shape is particularly useful when it is desired to enhance a component of the microwave field. For example, when it is desired to couple antenna 34 to resonator layer 12 via the electric field component, the pattern can be configured such as to enhance the electric field component of the microwave radiation. In some embodiments of the present invention the pattern defines one or more gaps near the end of the antenna. The gaps can be oriented generally perpendicularly to the longitudinal axis 20.

A typical width of antenna 34 is from about 0.5 mm to about 3 mm. A typical electrical resistance of antenna 34 is about 50 ohms.

Figure 3:
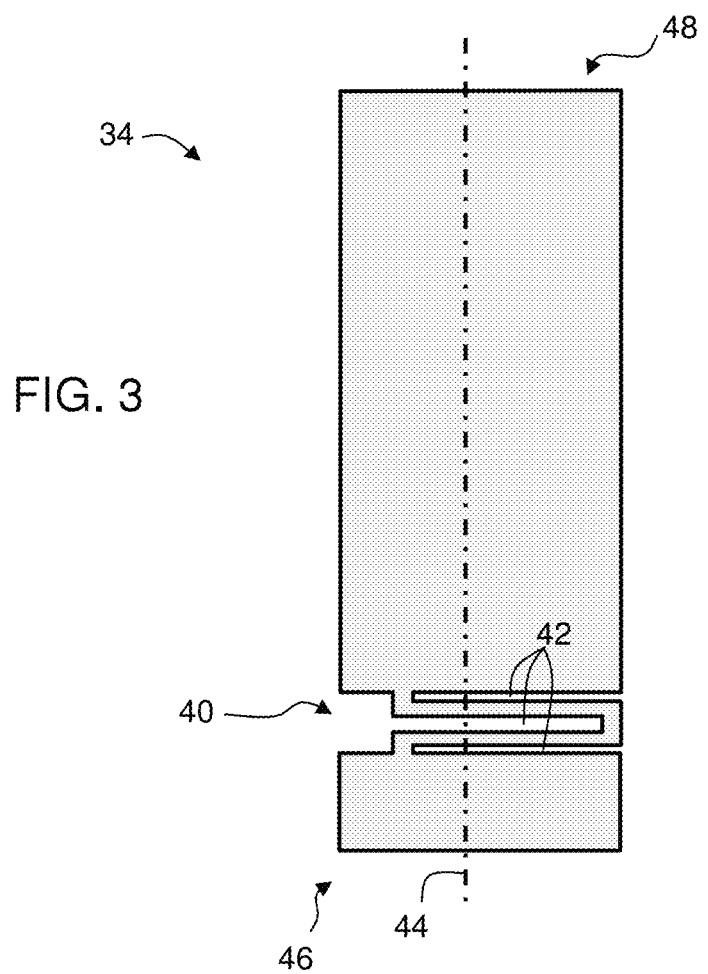
FIG. 3 is a schematic illustration of an antenna feed to the resonators according to some embodiments of the present invention.

A representative example of a patterned shape of antenna 34 according to some embodiments of the present invention is illustrated in FIG. 3. Shown in FIG. 3 is a pattern 40 which comprises several elongated gaps 42 within antenna 34. In the representative illustration of FIG. 3 pattern 40 includes three gaps, but the present embodiments contemplate any number of gaps in pattern 40. Gaps 42 are oriented generally perpendicular to the longitudinal axis 44 of antenna 34. Axis 44 of antenna 34 is optionally and preferably generally parallel to longitudinal axis 20 (not shown, see FIGS. 2A and 2B). Pattern 40 is optionally and preferably near an end 46 of antenna 34. When antenna 34 is positioned to assemble system 10, end 46 of antenna 34 is preferably closer to layer 12 than the opposite end 48. In various exemplary embodiments of the invention the opposite end 48 does not include a pattern.

Pattern 40 is optionally and preferably an interdigitated pattern.

The term "interdigitated pattern" as used herein describes a pattern in which elongated gaps extend between each other with every other gap being open to one direction and the alternate gap(s) being open to the opposite direction.

When pattern 40 includes three gaps, the width of the middle gap is optionally and preferably larger than the width of the other gaps.

The typical width of gaps 42 of antenna 34 is from about 10 microns to about 100 microns.

Refereeing again to FIGS. 1A-C, system 10 optionally and preferably comprises a distance adjusting unit 50 which is configured for adjusting a distance between microwave feed 26 and resonator layer 12. For example, unit 50 can establish motion of substrate 38 in a direction perpendicular to antenna 34, e.g., by means of a track 52, an X-Y stage or any other mechanism.

The advantage of having adjustable distance between feed 26 and layer 12 is that it provides adjustable coupling between feed 26 and resonator layer 12 and can therefore improve the spin sensitivity of system 10. For example, the distance between feed 26 and layer 12 can be adjusted to accommodate different types of samples, since each sample may have its own dielectric properties and thus affect the properties of the resonator and the coupling. The distance can also be adjusted to compensate for varying resonator properties at different temperatures.

It was realized by the present inventor that the adjustable distance is advantageous over conventional surface resonators, particularly those used for ESR, since conventional surface resonators have fixed distance between the transmission microstrip line and the resonator section. In such conventional surface resonators, the back side of the substrate is grounded so that they are manufactured with the microwave feed and the resonator on the same side of the substrate and the sample is placed between the microwave feed and the resonator.

Figure 4:
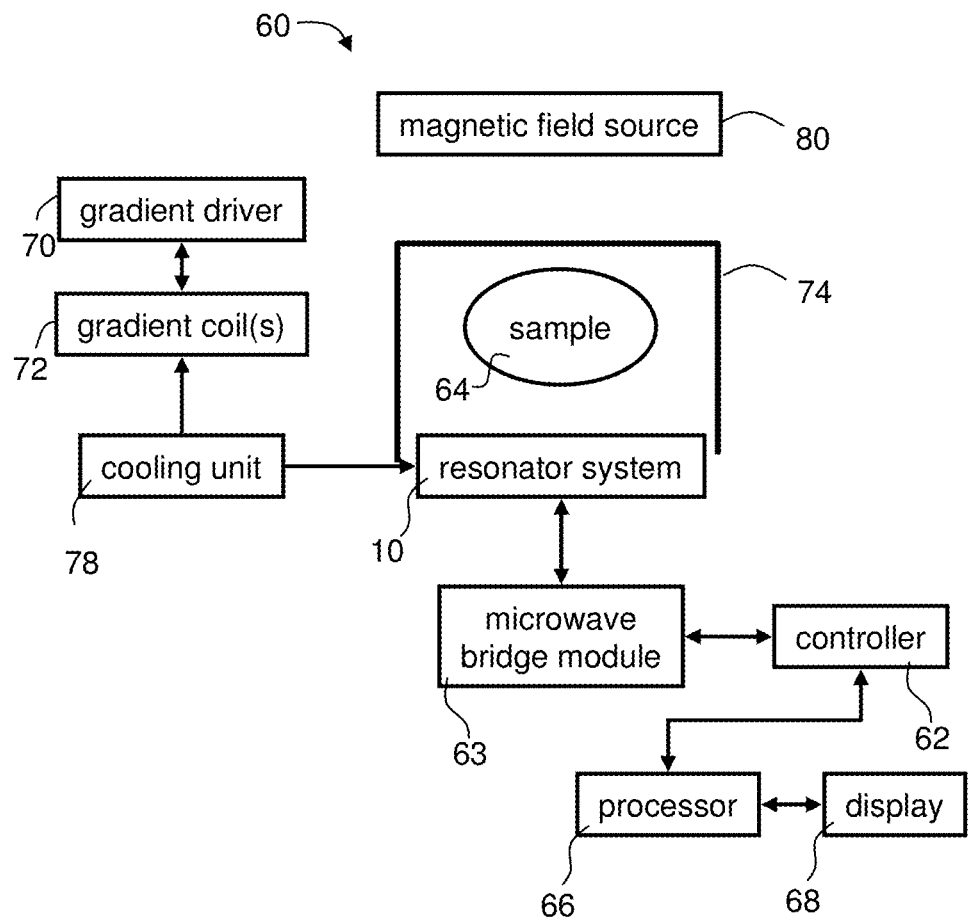
FIG. 4 is a schematic illustration of an ESR system, according to some embodiments of the present invention.

Reference is now made to FIG. 4 which is a schematic block diagram illustrating an ESR system 60, according to some embodiments of the present invention. ESR system 60 can be an ex-situ or in-situ ESR system. When system 60 is an ex-situ system, the sample is external to the all the magnetically active elements of the system, including the static field source and gradient coils, if present, and the resonator. When system 60 is an in-situ system, the sample is external to the resonator but one or more of the other magnetically active elements can optionally surround the sample.

System 60 comprises a resonator system, e.g., system 10 as further detailed hereinabove, a controller 62 for activating resonator system 10, optionally and preferably via a microwave bridge 63, to induce ESR signals within a sample 64 and to receive the signal from sample 64. System 60 further comprises a data processor 66 which is configured for receiving from controller 62 an input indicative of the ESR signals, and providing ESR analysis responsively to signals. Processor 66 can output the results of the analysis to a display device 68 or a computer retable medium (not shown). Optionally, processor 66 generates an image of sample 64 based on the ESR signals, and outputs the image to display 68 or a computer readable medium.

System 60 can also comprise a source 80 of static magnetic field, which can be of any type, e.g., a permanent magnet or an electromagnet. The static magnetic field defines a statically magnetized region, which extends at least into a portion of sample 64.

System 60 optionally comprises one or more gradient coils generally shown at block 70. For clarity of presentation, gradient coils 70 are shown as a single block, but more than one coil can be employed. For example, X-Y gradient coils can be arranged for providing magnetic field with gradients along the X and Y axis, as known in the art. Optionally, coils 70 are single-sided coils. This embodiment is particularly useful when system 60 is an ex-situ ESR system.

Coils 70 are optionally and preferably driven by a gradient driver 72, which is known per se. The resonator system 10 and gradient coils 70 can work in CW or pulse mode as desired. For CW mode, the inductance of coils 70 is preferably from about 10 μH to about 100 μH. In pulse mode, the inductance of coils 70 is preferably from about 1 μH to about 10 μH.

In various exemplary embodiments of the invention coils 70 and driver 72 are designed and constructed to produce gradients of from about 10 T/m to about 1000 T/m. This can be achieved when coils 70 are sufficiently small (e.g., from about 0.5 mm to about 3 mm) and are placed sufficiently close to sample 64 (e.g., within a distance of from about 0.5 mm to about 3 mm from the sample). Coils 70 are preferably embedded in a heat conductive electrically isolated adhesive (e.g., Arctic Alumina or the like) that efficiently dissipates the heat out of the coils. The adhesive is preferably selected to allow operating the coils at sufficiently high duty cycle (e.g., duty cycle of 1-5%) and pulse rate of from about 1 kHz to about 20 kHz. The pulse duration can be from about 0.1 μs to about 10 μs and the current provided by driver 72 can be from about 1 A to about 100 A.

In some embodiments, system 60 comprises a microwave shield 74 for shielding resonator system 10 from magnetic fields coming from outside shield 74. Shield 74 reduces the radiation losses of resonator system 10 and also helps lowering the noise in the signals obtained by resonator system 10, hence improves the SNR. Shield 72 is preferably transparent to the magnetic fields generated by gradient coils 74. For example, shield 74 can be gold foil having thickness of from about 0.2 μm to about 1 μm.

In various exemplary embodiments of the invention system 60 comprises a cooling unit 78 configured to cool resonator system 10 and optionally also gradient coils 70. For example, unit 78 can deliver cold fluid, for example nitrogen at 77K or helium at 4.2K, or any other inert cryogenic fluid or gas, depending on the temperature to which the resonator system and or gradient coils are to be cooled.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

In the present example, a comparative study of several types of resonator systems is described. The study was performed by the inventors of the present invention and published in Review of Scientific Instruments 81, 104703, 2010 as an article entitled "Sensitive surface loop-gap microresonators for electron spin resonance". The contents of this article are hereby incorporated by reference.

I. Introduction

The present inventors recognize that ESR has relative low sensitivity, compared to other spectroscopic techniques (e.g., fluorescence or mass spectroscopy). This is mainly due to the low energy gap between the magnetic-field ESR transitions observed during the ESR experiment. Some conventional ESR spectrometers use induction (Faraday) detection with a high quality (Q-factor) rectangular cavity, which enables a typical sensitivity of about $10^9$ spins/$\sqrt{Hz}$. Other detection methods include magnetic resonance force microscopy (MRFM), scanning tunneling microscopy combined with ESR (STM-ESR), and indirect optical detection via nitrogen-vacancy (NV) center in diamond.

The present example describes high sensitivity induction-detection-based systems which includes surface loop-gap microresonators with variable coupling capabilities that can improve the spin sensitivity of conventional ESR systems, based on induction detection. Such resonators can be useful for a variety of applications such as: detection and imaging of defects on the surface and sub-surface of semiconductors; measurements of paramagnetic monolayers; inspection of small biological systems, such as single cells internalized by stable radicals or paramagnetic labeled membranes; and, in general, performing ESR spectroscopic measurements on spin-limited samples.

II. The Sensitivity of Induction-Detection ESR

Induction detection ESR experiments can be carried out in continuous-wave (CW) or in pulsed mode. The former can be applied to all types of samples, but with lower spectroscopic versatility and smaller sensitivity per entire spectrum acquisition. The latter is generally more versatile and sensitive, and is more suitable for samples with a relatively long spin-spin relaxation time, $T_2$. The sensitivity of both CW and pulsed methods is equally dependent on typical sample and resonator characteristics, up to a constant. Thus, although the present theoretical and experimental work is conducted in conjunction with pulsed mode instrumentation, the parametric sensitivity behavior is relevant also to CW mode. The single-shot signal-to-noise-ratio (SNR) of a small sample with a volume $V_v$ (e.g., a single voxel of an ESR image out of a larger sample) in a pulsed ESR experiment is given by the expression:

$$SNR_{pulse}^{single\ shot} \approx \frac{M\omega_0 V_V}{4\sqrt{k_b T \Delta f}} C_p \quad [1]$$

where M is the specific net magnetization of the sample (units of $[JT^{-1}m^{-3}]$), as given by the Curie law, $\omega_0$ is the Larmor angular frequency, $k_b$ is the Boltzmann constant, T is the temperature in which the experiment is carried out (assumed to be the same for the spins and the resonator), and $\Delta f$ is the bandwidth of signal acquisition. Eq. [1] assumes that the noise is four times larger than the theoretical lower limit (for a dominant Johnson noise source). The factor $C_p$ is the resonator's field-power conversion ratio, i.e., the amplitude of the $B_1$ field in the resonator produced by 1 W of excitation microwave power, which is given by the expression (for a critically coupled resonator):

$$C_p \approx \sqrt{Q_u \mu_0 / 2 V_c \omega_0} \quad [2]$$

Here, $\mu_0$ is the free space permeability and $Q_u$ is the unloaded quality factor of the resonator. The symbol $V_c$ represents the resonator's effective volume, which is equal to the volume of a small hypothetical sample $V_v$ (for example $[1\ \mu m]^3$, usually located at the point where the resonator's microwave magnetic field is maximal), divided by the filling factor of this small sample.

As described below, there are resonators in which the $B_1$ microwave field can have very large spatial variations within the resonator (in areas where the sample is placed). This, in principle, means that $C_p$ can vary significantly for different locations in the resonator volume. To account for that the present inventors define $C_p$ in a more general manner, in which $V_c$ is considered not as a single value for the resonator but rather as a variable, depending on which $V_v$ is chosen inside the resonator. Thus, for example, if $V_v$ is located at the strongest $B_1$ field point in the resonator, its corresponding $V_c$ (according to the definition above) is the smallest and $C_p$ is the largest. On the other hand, if $V_v$ is located at a relatively weak area of $B_1$ in the resonator, then its $V_c$ is relatively large and $C_p$ is small. This notion of a position-specific $C_p$ will be used in the discussion below.

Equation [1] can be combined with eq. [2] to obtain the expression:

$$SNR_{pulse}^{single\ shot} \approx \frac{\sqrt{2\mu_0}\ M\omega_0 V_V}{8\sqrt{V_c}\ \sqrt{k_b T \Delta f}} \sqrt{\frac{Q_u}{\omega_0}}. \quad [3]$$

Therefore, for an acquisition time of one second the SNR is:

$$SNR_{pulse}^{one\ second} \approx \frac{\sqrt{2\mu_0}\ M\omega_0 V_V}{8\sqrt{V_c}\ \sqrt{k_b T(1/\pi T_2^*)}} \sqrt{\frac{Q_u}{\omega_0}} \sqrt{\frac{1}{T_1}} \quad [4]$$

under the assumption of an averaging with a repetition rate equal to $1/T_1$ for SNR improvement, and that the chosen excitation bandwidth matches the linewidth of the imaged paramagnetic species in the sample, $\Delta f = 1/\pi T^*_2$. The result of eq. [4] can be converted into sensitivity expressed by the minimal number of detectable spins/$\sqrt{Hz}$, by assuming SNR=1 and knowing that $$\frac{MV_V B_F}{\mu_B}$$

is the number of spins in the small sample:

$$\frac{MV_V B_F}{\mu_B} = Sensitivity_{\frac{spins}{\sqrt{Hz}}} \approx \frac{8\sqrt{V_c}\ \sqrt{k_b T(1/\pi T_2^*)}}{\mu_B \omega_0 \sqrt{2\mu_0}} \sqrt{\frac{\omega_0}{Q_u}} \sqrt{T_1}\ B_F, \quad [5]$$

where $B_F$ is the Boltzmann population factor $$B_F = \frac{1 + e^{\frac{\hbar\omega_0}{k_B T}}}{1 - e^{\frac{\hbar\omega_0}{k_B T}}}$$

and $\mu_B$ is Bohr's magneton.

In CW ESR, sensitivity is often reported as spins/gauss/$\sqrt{Hz}$, which provides the minimal detectable number of spins of a sample with a linewidth of 1 gauss that does not saturate.

For such samples, CW sensitivity expressed in spins/gauss/√Hz would be similar to the value of the pulsed-operation sensitivity expressed in spins/√Hz. For other types of samples and when one does consider saturation conditions, the comparison also depends on other factors, such as available power, modulation amplitude, etc.). However, as noted above, if one assumes optimal power and modulation conditions, CW sensitivity can be expressed in spins/√Hz so that the SNR's general functional dependence on system parameters is similar for both CW and pulsed ESR.

The present inventors found that it is advantageous to reduce the size of the resonator and increase its absolute spin sensitivity, particularly when the sample of interest is much smaller than $V_c$ (as in the case of single spin detection or in imaging experiments, where $V_v$ is a typical small voxel size).

In recent work by the present inventor, high-permittivity single crystals were employed leading to a relatively small $V_c$ of about 1 mm$^3$ at 17 GHz. Such type of resonator (with $Q_u$=1000) enables a spin sensitivity of about $5.3 \times 10^7$ spins/√Hz (according to eq. [5]), which was verified in an imaging experiment (using a LiPc sample having $T_1$=3.5 μs and $T_2$=2.5 μs).

It was found by the present inventor that for any given resonance frequency, the size of the dielectric resonator decreases as the permittivity of its material increases (linear dimensions proportional to $1/\sqrt{\in}$, see Blank et al., 2009). It is recognized that the upper limit of available permittivity values in both natural and man-made materials is a few hundreds (around room temperature).

Narkowicz and co-workers have recently constructed planar microresonators with a diameter as small as 20 μm and resonance frequency of ~14 GHz. Other microstrip-based ESR surface resonators that are half-wavelength long and have a somewhat simpler design but are larger in size have also been described. The small $V_c$ of this type of structures enables them to achieve very high spin sensitivity, even though their Q-factor may be relatively low. In their work, Narkowicz and his co-workers calculated that a 20-μm-diameter resonator, which is used to measure a DPPH sample with ~2-G linewidth in CW mode, can provide a minimal detectable number of ~$2 \times 10^8$ spins/√Hz. Their experimentally measured value was found to be about $10^9$ spins/√Hz.

It was found by the present inventors that although conventional planar resonator configuration are promising, they have some limitations. One such limitation is their low Q-factor (around 15 for the small resonators). Another limitation is the lack of convenient variable coupling capabilities to accommodate different types of samples and/or to compensate for varying resonator properties at different temperatures. In conventional systems, the coupling tuning/matching is based on fixed microstrip patches that tend to be much larger than the resonator. This leads to the microwave magnetic field spreading out to many parts of the resonator assembly and especially along the coupling tuning/matching patches, which increases the effective volume of the resonator ($V_c$) and thus reduces its overall sensitivity.

The present example describes a new family of surface microresonators developed by the present inventors. The microresonators, denoted "surface loop-gap microresonators," are with variable coupling capabilities. The microresonators provide flexibility for accommodating a variety of samples without affecting resonator matching. Furthermore, the microwave magnetic fields are confined only to the resonator's structure, leading to a very small $V_c$ and therefore to improved spin sensitivity.

III. Surface Loop-Gap Microresonators

Several planar ESR resonators are described in the literature. For example, some designs employ either straight or curved self-resonant half-wavelength (λ) microstrip transmission lines. Other designs use smaller microstrip-based structures that are made resonant by the addition of an appropriately-shaped printed tuning stub with distributed capacitance. These structures, however, have fixed coupling mechanisms based on a microstrip transmission line with a certain fixed resonator-line distance gap, and often also with some matching and tuning stubs leading to the resonator. These stub components, especially those for tuning, significantly increase the resonators' effective volume.

The present Example is partially based on the concept of cylindrical loop-gap resonators but modify this concept by shrinking their height down to the point that they become effectively surface resonators. The resonance frequency, v, of a non-planar loop-gap resonator can be estimated through the expressions:

$$L \approx \frac{\mu_0 \pi r^2}{z + 0.9r}, \quad C \approx \frac{\varepsilon_r \varepsilon_0 (w+t)(z+t)}{t} \quad [6]$$

$$v = \frac{1}{\sqrt{2\pi LC}} \quad [7]$$

Here, r, w and z are the radius, wall thickness and height of the cylinder, t is the gap width, $\mu_0$ is the free-space permeability, $\in_r$ is the dielectric constant of the filler material in the gap, and $\in_0$ is the free-space permittivity. For v=15 GHz, typical dimensions of a small resonator used for conventional ESR spectroscopy may be: r=0.62 mm, z=3.5 mm, w=0.35 mm, and t=0.04 mm (with no dielectric material in the gap).

When the height z is decreased to the micron range according to some embodiments of the present invention, the radius, r, can also be decreased so as to reduce the volume of the resonator. According to eq. [6] this would result in a decrease in loop inductance but mainly in a sharp reduction of the "gap" capacitance, both of which would boost the resonance frequency to an unwanted regime. In various exemplary embodiments of the invention one of the following modifications are made, so as to regain gap capacitance: (a) The surface resonator is optionally and preferably applied to a substrate with high permittivity (large $\epsilon_r$), and (b) the width, t, of the gap is optionally and preferably decreased.

Figure 5A:
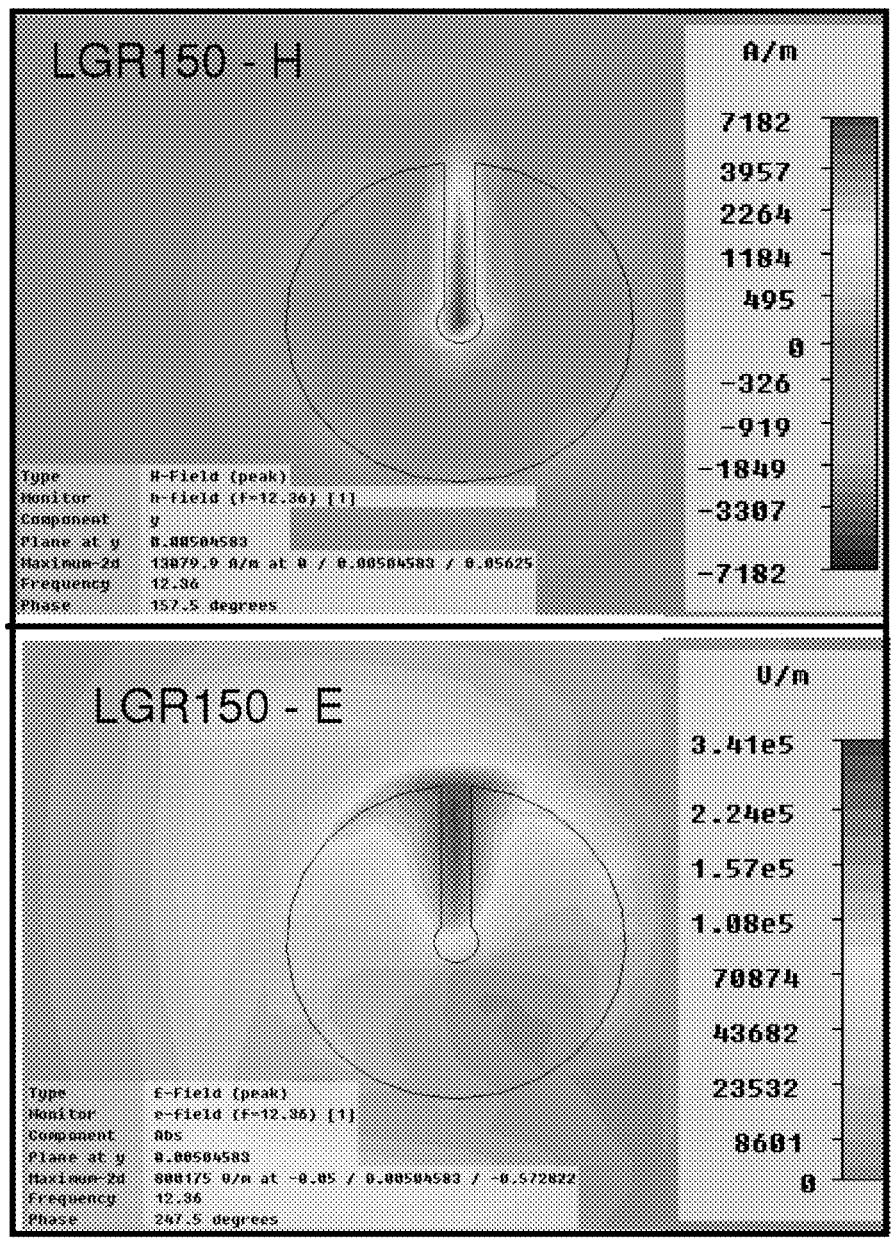
FIGS. 5A-B show calculated microwave magnetic- and electric-field distributions of two resonators, according to some embodiments of the present invention.

The present Example includes two types of surface loop-gap microresonators:

(a) LGR150: The resonator's design and dimensions are according to FIG. 2A above. The resonator layer was made of gold, 0.3 μm in thickness, the substrate was a 1.6×1.6×0.22-mm single-crystal rutile substrate with no ground plane on the bottom side. Rutile (TiO$_2$) has an anisotropic crystal structure, leading to anisotropic permittivity of about 165 along the crystal's C-axis and about 85 along the other two axes (at room temperature). In this design, the crystal's C-axis is in the resonator's plane, perpendicular to the gap's long axis. The structure's resonance frequency, calculated by eq. [7], is 23.2 GHz (assuming that the permittivity in the gap is 165). Capacitance is probably underestimated by eq. [6] and certainly other distributed effects exist, leading to the more accurate result obtained by finite-elements calculation of a resonance frequency of 12.36 GHz. The calculated microwave magnetic- and electric-field distributions of this resonator are shown in FIG. 5A. A clear resonance mode is apparent with the microwave magnetic field centered in the "loop" area and the microwave electric field located mainly in the "gap" area. In contrast to conventional loop-gap resonators, there is a large variation in the magnetic and electric fields along the "gap". This is because w is much larger (in proportion to r) than in common loop-gap configurations, a fact that gives it a distributed "flavor" in addition to its lumped role.

Figure 5B:
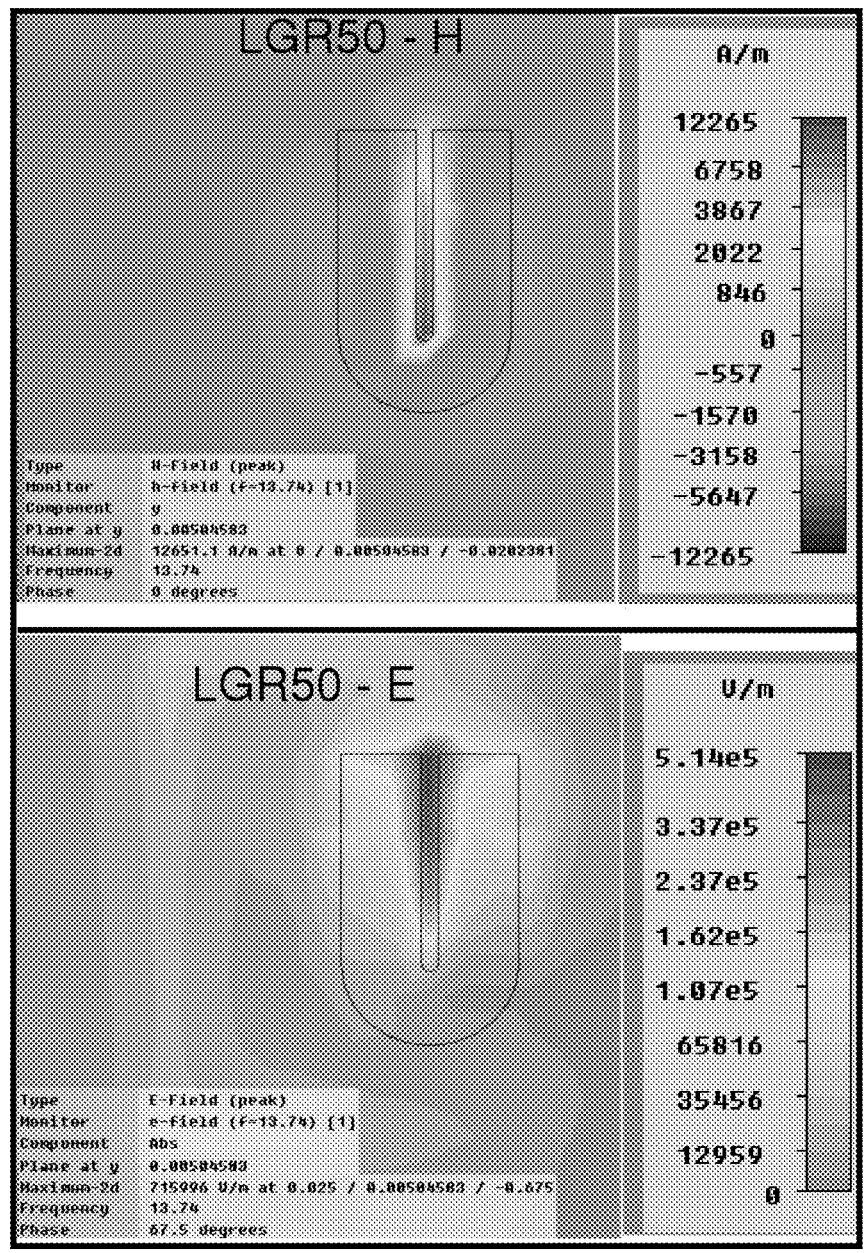

(b) LGR50: The resonator's design and dimensions are according to FIG. 2B above. The resonator layer was made of gold, 0.3 µm in thickness, the substrate was a 1.5×1.5×0.22-mm single-crystal rutile substrate with no ground plane on the bottom side. In this design, the crystal's C-axis is in the rutile plane, parallel to the gap's long axis. The resonance frequency of this structure calculated by the finite-elements software is 13.74 GHz. The calculated microwave magnetic- and electric-fields distributions are shown in FIG. 5B, which presents a clear resonance mode whose microwave field behavior is similar to that of the LGR150. The distributed nature of the "gap" area, as described above, is even more pronounced here than in the LGR150 configuration.

Figure 6A:
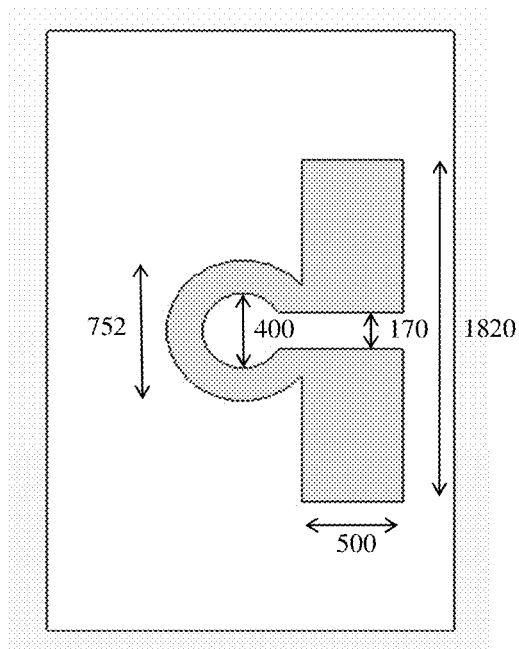
FIGS. 6A and 6B show dimensions and field disruptions of an Omega shaped resonator used in experiments performed according to some embodiments of the present invention.
Figure 6B:
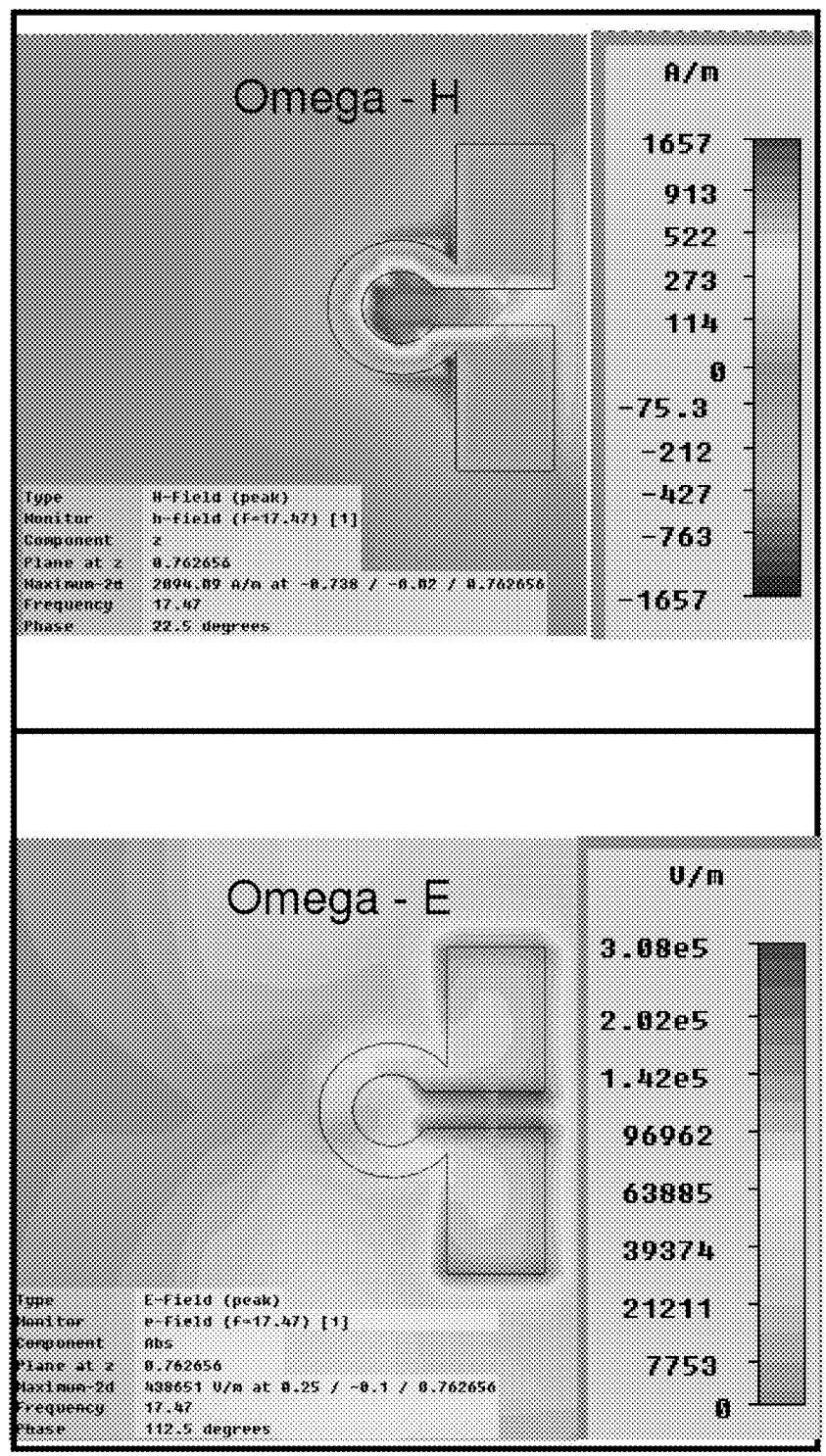

(c) Omega: The resonator's design and dimensions are shown in FIG. 6A. The Omega resonator is made of Rogers RT/doroid 6010LM microwave substrate with permittivity of 10.2 and thickness of 625 µm. The substrate has two 35-µm copper layers deposited on its upper and bottom sides. The Omega resonator is on the upper side with the ground plane layer remaining on the bottom side. The resonance frequency of this structure is the one in which the entire length of this curved microstrip transmission line structure is about $\lambda/2$. For 17 GHz this corresponds to about 3250 microns (for the substrate and line parameters given above). Actual finite-element calculations found a resonance frequency of 17.46. The calculated microwave magnetic- and electric-field distributions are shown in FIG. 6B. A resonance mode is apparent with the microwave magnetic field centered in the "loop" area and the microwave electric field located along the conductor edges.

Figure 7A:
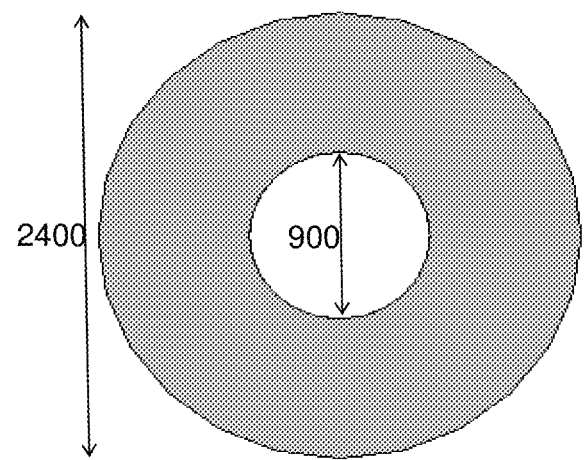
FIGS. 7A and 7B show dimensions and field disruptions of a non-planar purely dielectric resonator used in experiments performed according to some embodiments of the present invention.
Figure 7B:
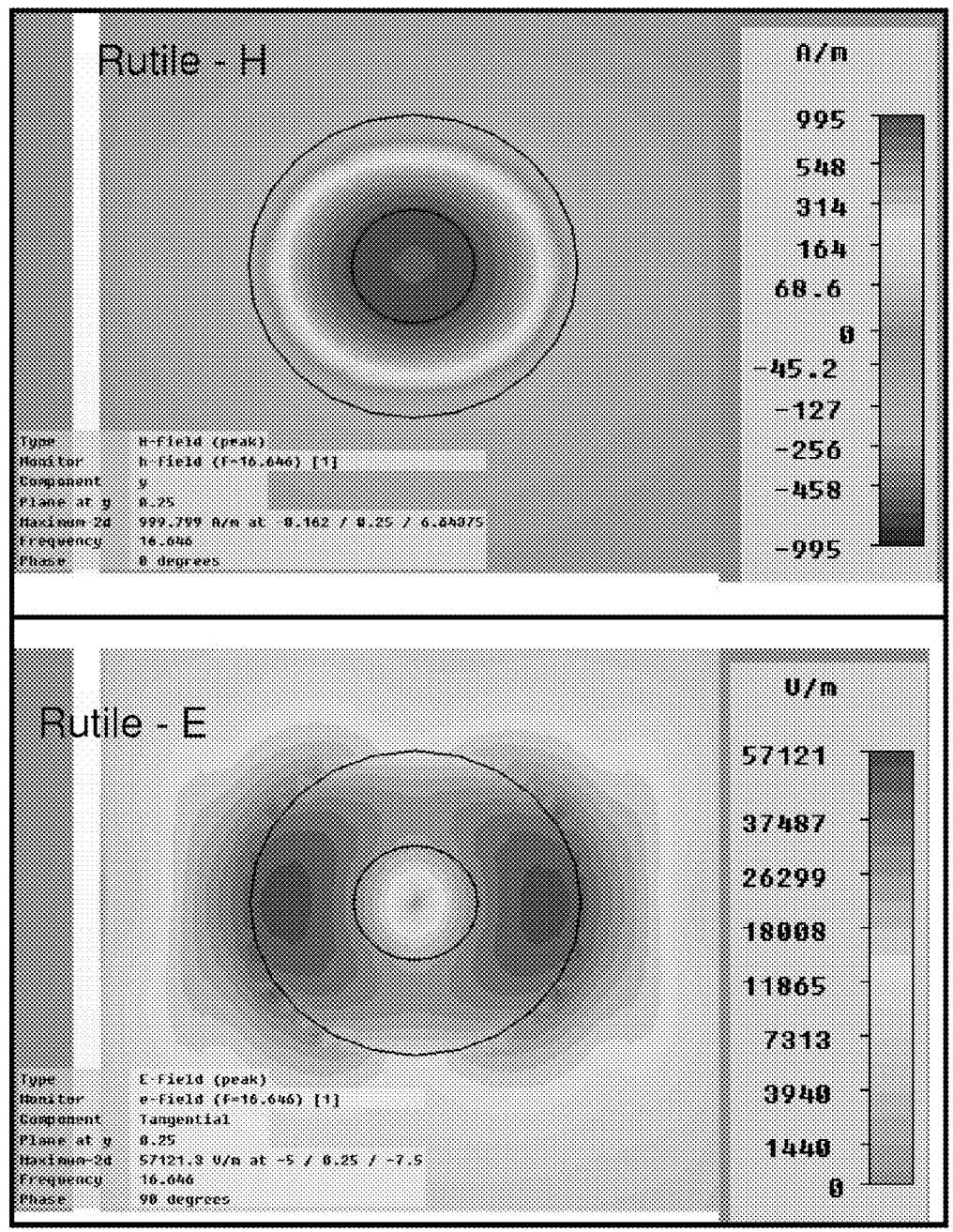

(d) Rutile: this resonator is a single ring dielectric resonator. It is not of the surface type, and was used in this study for comparison a resonator made of single-crystal rutile. The resonator's design and its dimensions are shown in FIG. 7A. The rutile's C-axis is in the ring plane (along the x-axis). The resonator has a thickness (height) of 500 µm and is located in a metal cylindrical shield with an inner diameter of 4.6 mm (resonators a-c above were modeled without any shield). The resonance frequency was calculated by finite-element simulation and found to be 16.65 GHz. The microwave magnetic- and electric-field distributions are shown in FIG. 7B. A resonance mode (known as $TE_{01\delta}$ in the context of dielectric resonators) is apparent with the microwave magnetic field maximum at the center of the ring and the electric field maximal around the ring. The mode has no complete cylindrical symmetry due to the anisotropic permittivity of the single-crystal rutile.

Figure 8:
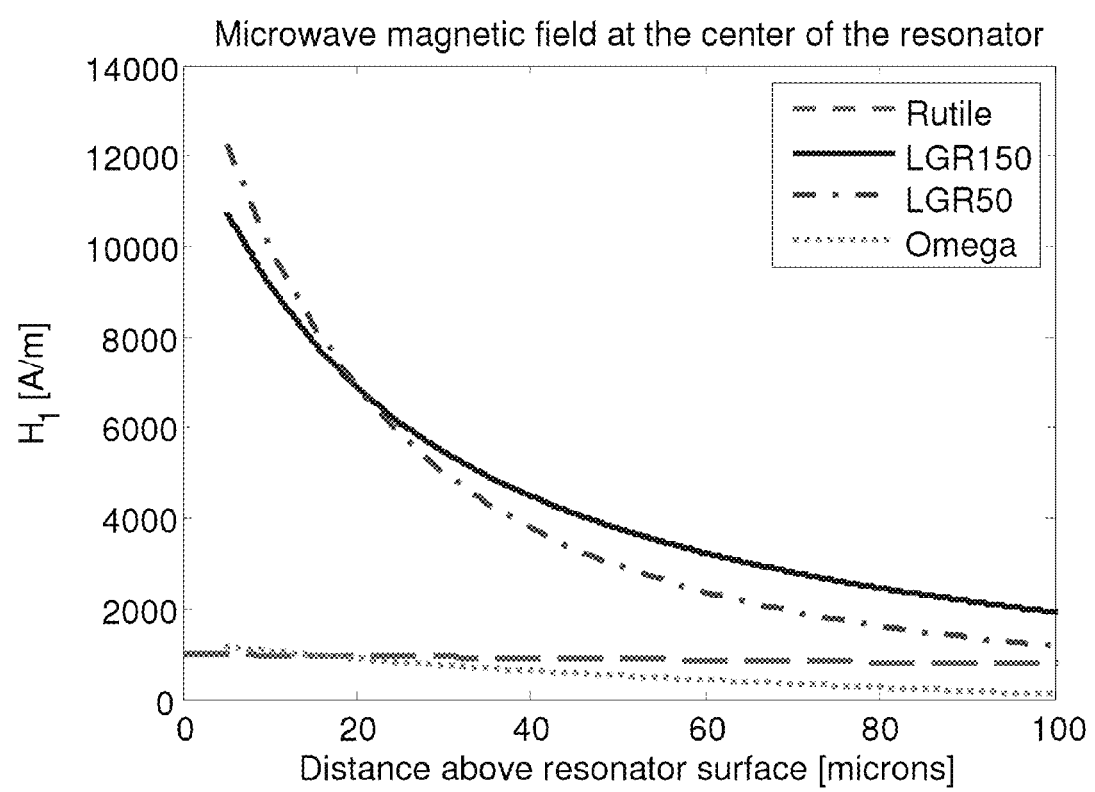
FIG. 8 shows spatial dependence of the fields shown in FIGS. 5A-B, 6B and 7B, as calculated according to some embodiments of the present invention.

Some of the differences between configurations a-d will now be considered. The spatial dependence of fields shown in FIGS. 5A-B, 6B and 7B is shown in FIG. 8 for the location of the maximum magnetic field (at the center of the resonators). The small surface resonators have a very steep field dependence on height, with the field falling to 50% of its maximal value after ~20 and ~30 µm for the LGR50 and LGR150 configurations, respectively. The fields in the Omega resonator fall to 50% of their maximal value after ~42 µm, while the fields from the Rutile dielectric resonator change by only ~20% in the first 100 µm above the resonator's surface.

Figure 9A:
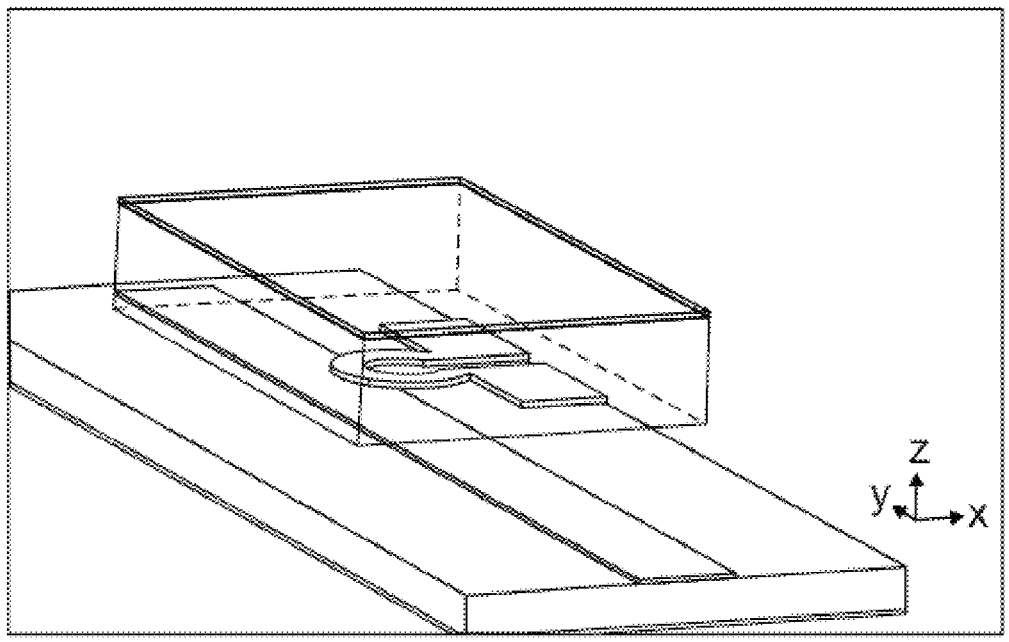
FIGS. 9A-B are schematic illustrations of coupling techniques used in experiments performed according to some embodiments of the present invention for the resonators shown in FIGS. 6A and 7A.
Figure 9B:
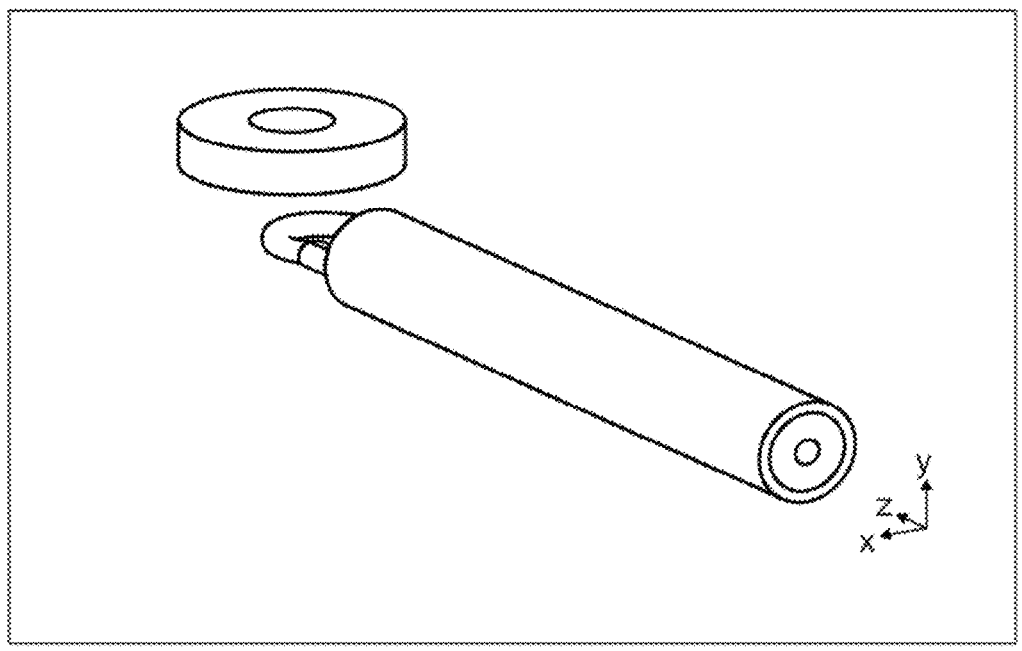
Figure 10A:
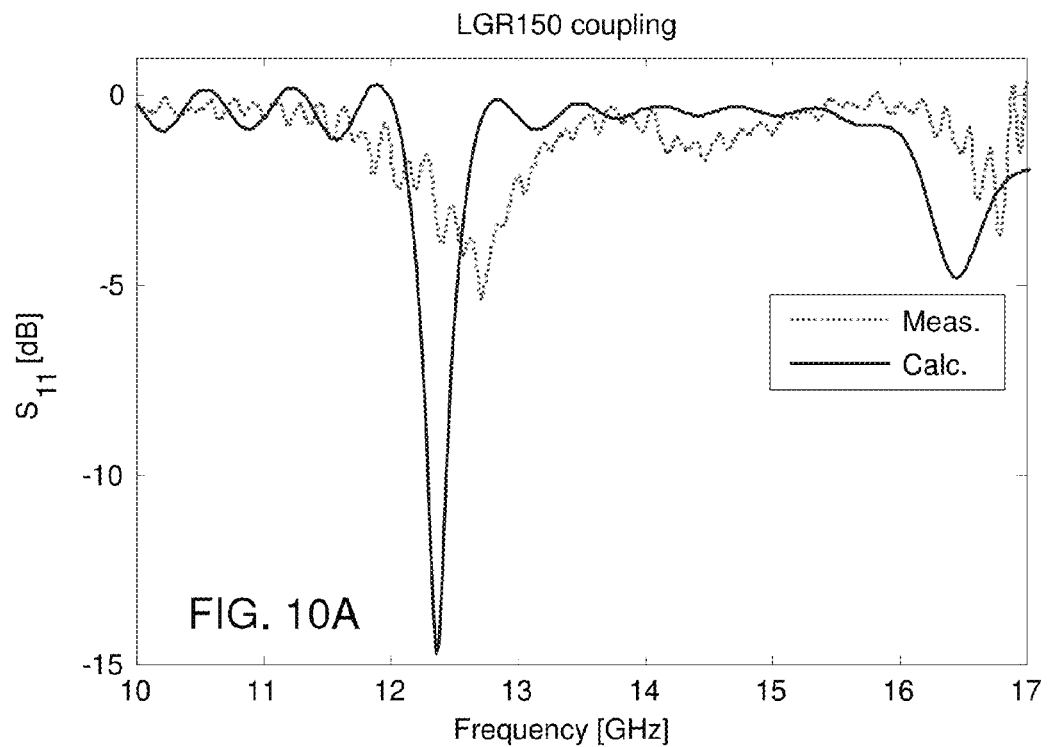
FIGS. 10A-D show calculated (solid blue) and measured (dotted red) coupling properties ($S_{11}$ parameters vs. frequency), as obtained in experiments performed according to some embodiments of the present invention.
Figure 10B:
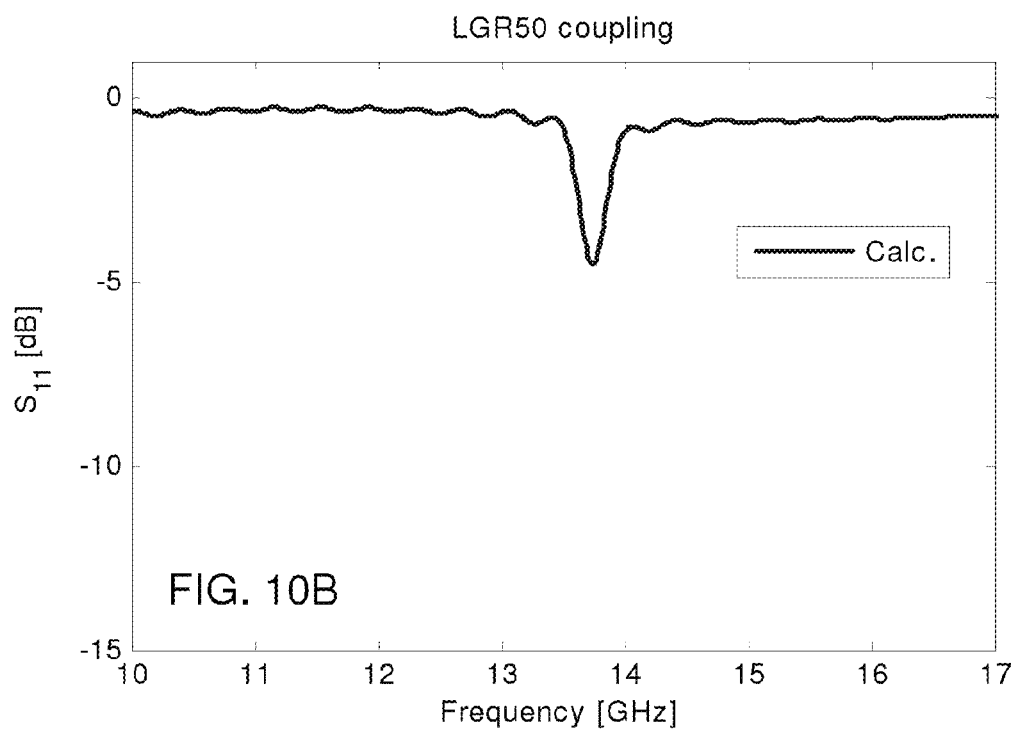
Figure 10C:
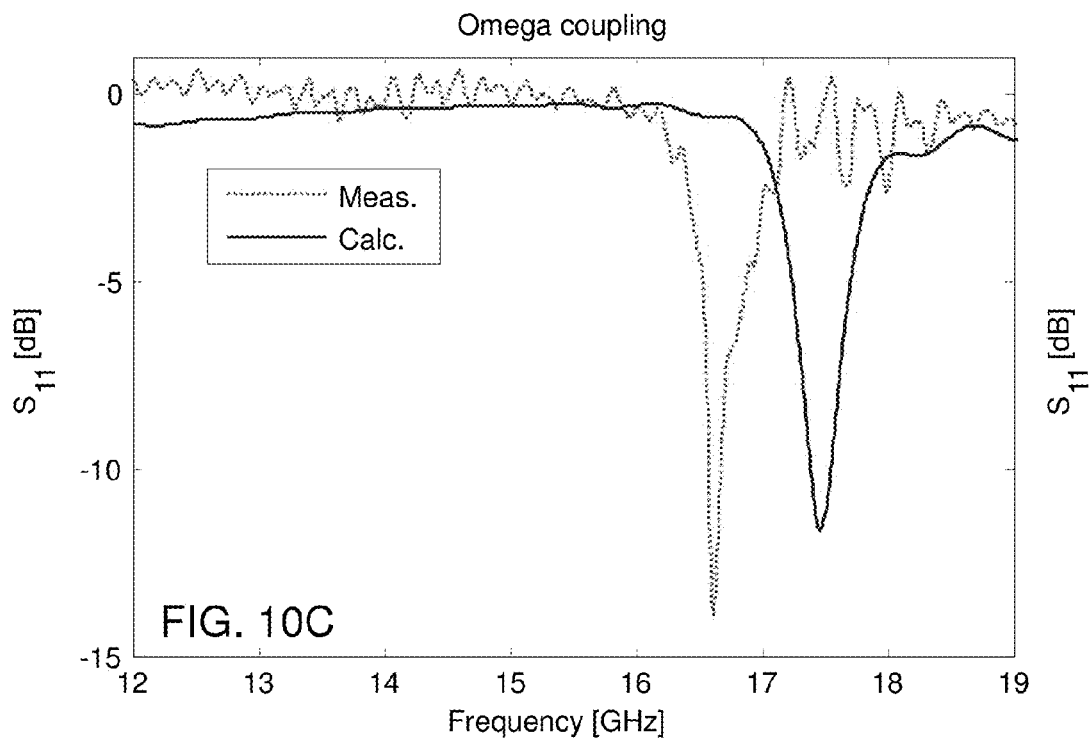
Figure 10D:
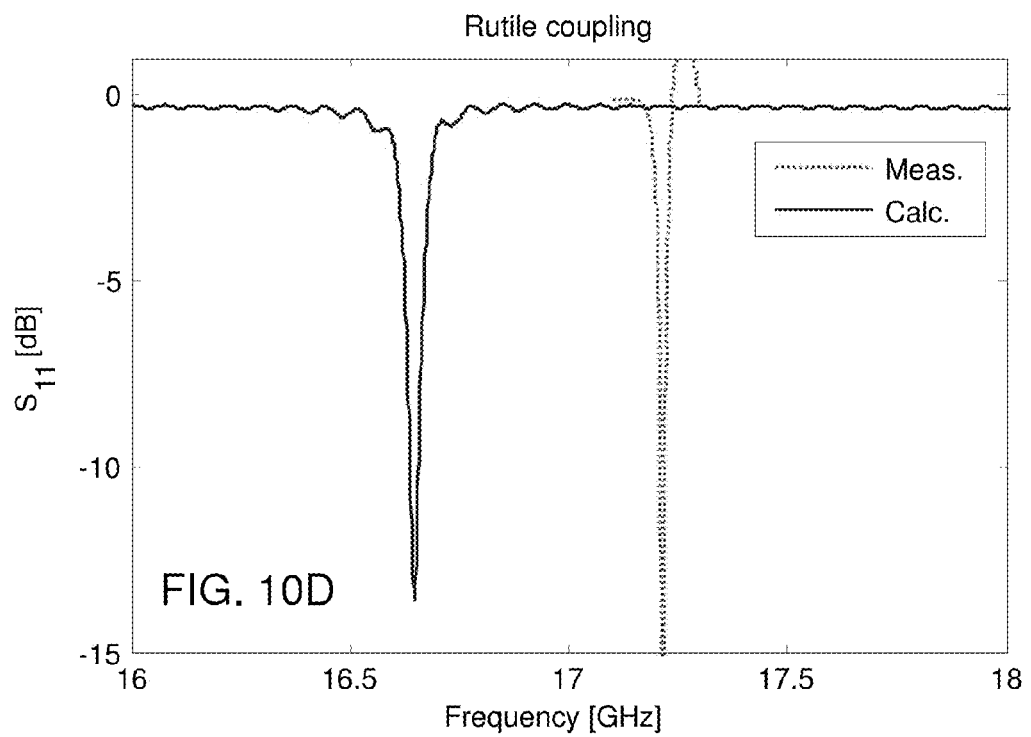

The coupling method for the resonators presented in this example is adjustable. This enables accounting for the varying properties of the resonator when different samples are inserted into it, or when its properties change at different temperatures. It is advantageous to design the coupling such as not to interfere with sample positioning. In the surface resonators presented in the present example, the samples are placed on their upper (metallic) part, and the coupling mechanism approaches the resonators from the bottom (the side with the dielectric layer). The coupling methods used for configuration (a) and (b) above are as illustrated in FIGS. 1A and 1B, respectively, and the coupling methods used for configurations (c) and (d) are illustrated in FIGS. 9A and 9B, respectively.

For the LGR150, LGR50 and Omega resonators, a 550-µm-wide standard microstrip line on a 254-µm-thick substrate with $\in=3.5$ was used. Coupling in the LGR50 and the LGR150 models is done via the E-field component, as illustrated in FIGS. 1A-B, and in the Omega resonator it is done through the H-field component, as illustrated in FIG. 9A. In the case of the LGR50 and 150 resonators, the small thickness of the substrate enables coupling from the back, leaving an open space on top of the resonator for the sample. Coupling can be altered by changing the position of the line with respect to the resonator. This is achieved by placing the microstrip line on movable XY linear stages (not shown).

In the case of the Omega resonator, the ground plane prevents coupling from the back and the microstrip line is placed above the resonator. The line does not have to be in close proximity to the Omega resonator, leaving some space available in between for the sample. The relative position of the resonator with respect to the microstrip line changes the coupling properties and enables matching the resonator to the line when different samples are positioned on it (or between the line and the resonator in the case of the Omega-type device).

Variable coupling for the Rutile resonator (FIG. 9B) is achieved by means of a semi-rigid coaxial line with its center lead exposed and soldered to the shield conductor. This generates a magnetic loop that can be coupled via the H-field component to the resonator. As in the case of microstrip coupling, the relative position of the resonator with respect to the coaxial loop (adjusted by movable XY linear stages) changes the coupling properties.

The calculated coupling properties ($S_{11}$ parameters vs. frequency) for the four resonator structures are shown in FIGS. 10A-D (blue lines).

Table 1, below summarizes the calculated parameters for the four resonators presented above. These values are compared hereinunder to the experimental data that also appear in Table 1. Table 1 further lists the properties of a commercial Bruker miniature split ring resonator (MS-2) for reference purposes.

TABLE 1

|  | LGR150 | LGR50 | Omega | Rutile | MS-2[7] |
|---|---|---|---|---|---|
| $f_0^{calc}$ [GHz] | 12.36 | 13.74 | 17.46 | 16.65 | — |
| $f_0^{meas}$ [GHz] | 12.72 | — | 16.61 | 17.21 | 9.5 |
| $Q^{calc}$ | 28 | 68 | 25 | 260 | — |

TABLE 1-continued

| | LGR150 | LGR50 | Omega | Rutile | MS-2[7] |
|---|---|---|---|---|---|
| $Q^{meas}$ | 15 | — | 30 | 530 | 24 |
| $V_c$ [mm$^3$][1] | 0.0025 | 0.0012 | 0.036 | 2.32 | 18.8 |
| $P_{MW}$ [W] at max. sig.[2] | $12 \times 10^{-3}$ | — | $340 \times 10^{-3}$ | $45 \times 10^{-3}$ | — |
| $C_p^{calc}$ [Gauss/√W] | 164 | 159 | 14.7 | 12.5 | 1.2 |
| $C_p^{meas}$ [Gauss/√W][3] | 86 | — | 15 | 14 | 1 |
| Spin sensitivity [spins/√Hz] (calc. for LiPc)[4] | $1.9 \times 10^7/$ $1.1 \times 10^7$ | $7.1 \times 10^6/$ $5.2 \times 10^6$ | $4.5 \times 10^7$ | $8.4 \times 10^7$ | $3.7 \times 10^9/$ $1.5 \times 10^9$ |
| Spin sensitivity [spins/√Hz] (calc. for E' in SiO$_2$)[5] | $2.5 \times 10^8/$ $1.5 \times 10^8$ | $9.5 \times 10^7/$ $7.0 \times 10^7$ | $5.9 \times 10^8$ | $1.1 \times 10^9$ | $1.4 \times 10^{11}/$ $5.8 \times 10^{10}$ |
| Spin sensitivity [spins/√Hz] (meas. for E' in SiO$_2$)[6] | $3.1 \times 10^8/$ $1.8 \times 10^8$ | — | $3 \times 10^8$ | $4.5 \times 10^8$ | — |

[1]$V_c$ is calculated based on the filling factor of a point-like volume element $V_v$ (with a volume of 1 μm$^3$) located at the maximum field just above the resonator (5 μm above the surface). For the Rutile resonator, the point is 5 μm above the upper side of the ring. If $V_c$ is calculated based on the field at the center of the Rutile resonator, it is found to be ~1.3 mm$^3$.
[2]The measured microwave power going into the resonator at maximum ESR signal for the Hahn echo sequence with 90° and 180° pulse durations of 35 ns and 70 ns, respectively.
[3]The method for calculating $C_p$ from the measured $P_{MW}$ values is described below.
[4]The calculation assumes $T_2^* = 2.5$ μs and $T_1 = 3.5$ μs. The numbers in bold font are calculations assuming a resonance frequency of 17 GHz. The numbers in regular font are calculations carried out for the actual resonance frequency of the resonator (only in case it is much lower than 17 GHz).
[5]The calculation assumes $T_2^* = 0.1$ μs and $T_1 = 200$ μs. The numbers in bold font are calculations assuming a resonance frequency of 17 GHz. The numbers in regular font are calculations carried out for the actual resonance frequency of the resonator (only in case it is much lower than 17 GHz).
[6]The method for measuring spin sensitivity is described below. In the case of the LGR150 resonator, which operates at relatively low resonance frequency, Table 1 reports both the actual measured spin sensitivity (at 12.72 GHz, in regular font), and the projected spin sensitivity at 17 GHz (in bold font).
[7]This is a standard split-ring pulsed ESR resonator, available from Bruker, 2 mm in diameter and 6 mm long. Data is based upon Höfer et al. 2006.

IV. Experimental Methods

The four configurations described above were manufactured and their properties were measured. The surface loop-gap microresonators were manufactured out of a 220-μm-thick, 10×10-mm piece of rutile single crystal (MTI Corporation, Calif., USA) with 110 orientation (the C-axis is in the crystal surface plane). The details of this photolithographic procedure appear in Table 2, below. Following preparation, the individual resonators were cut from the large piece by means of a diamond wire saw.

TABLE 2

| | |
|---|---|
| Surface Preparation | Wafer type: TiO$_2$ Cleaning: Ultrasonic bath in acetone, methanol and iso-proponol (5 min. each). Final rinse with water. Heating: on plate at 300° C. for 10 min. |
| Photoresist coating | Photoresist type: Clariant AZ 5214 E Spin velocity: 1500 rpm Spin time: 1 min. |
| Pre-Bake | On a hotplate at 110° C. for 1.3 min |
| Exposure | System: Karl Suss MA-6 Mask Aligner Exp. type: Soft contact. Alignment gap: start with 35 μm and eventually bring to full contact Exp. time: 1.9 sec |
| Post-Bake | On a hotplate at 120° C. for 2 min. |
| Flat exposure | Exposure without mask on mask aligner for 15 sec. |
| Development | Total development time: 40 sec. |
| Metal Deposition | System: Airco Temescal FC-1800 E-beam evaporator. First layer: Ti (50 A°) Second layer: Au (3000 A°) |
| Lift-off | Ultrasonic bath in acetone for 5 min. |

The Omega resonator was manufactured using standard microwave circuit board production methods, based on the geometry shown in FIG. 6A (outsourced to Cidav Ltd. Israel).

The Rutile resonator was produced from a 500-μm-thick, 10×10-mm piece of rutile single crystal, similar to the one described above. It was first sliced to ~2.5×2.5-mm square pieces using a diamond wire saw and then drilled at the center using a diamond driller. The squares with the hole were then grinded to their required diameter by means of a conventional grinding-stone procedure.

Following manufacture, the resonators were placed on a mechanical fixture near the microwave feed lines, which were then connected to linear variable XY stages. The microwave lines were connected to a vector network analyzer (Agilent E8361A) which measured the resonators' $S_{11}$ parameters (for optimal coupling properties). The resulting measurements are shown in FIG. 6 (red lines). Sufficient coupling was obtained in all configurations, in good agreement with the theory, except for the LGR50. The latter model showed reasonable coupling when the microstrip line was attached to the front of the resonator, but coupling from the back was too weak to be measured reliably. Coupling to the rutile resonator, which has a much higher Q-factor than the surface resonators, was much easier and conformed well to the theoretical predictions. The measured resonance frequency and the Q-factor of the three resonators that showed good coupling are listed in Table 1, above.

V. Pulsed ESR Experimental Results

ESR signals were acquired for all resonator configurations using a test sample with a well-known spin concentration. The experiments were carried out on home-made pulsed ESR system. The chosen test sample was a 100-μm-thick SiO$_2$ slide irradiated by γ-irradiation from a $^{60}$Co source (carried out at the "Nahal Sorek" facility, Yavneh, Israel). This produced a rather homogenous distribution of the so-called E' paramagnetic center defects in the slide. The sample spin concentration was found to be ~$3 \times 10^{15}$ spins/cm$^3$ by comparing its double integral CW ESR signal to that of a 1-μM trityl solution in a capillary tube (both measured under the same condition in a commercial Bruker EMX X-band CW ESR system). During measurements, the sample was placed just above the surface loop-gap microresonator (LGR150 only).

As for the omega-type resonator, the sample was placed between the coupling line and the resonator. In the case of the rutile resonator, it was placed just above the dielectric ring.

Figure 11:
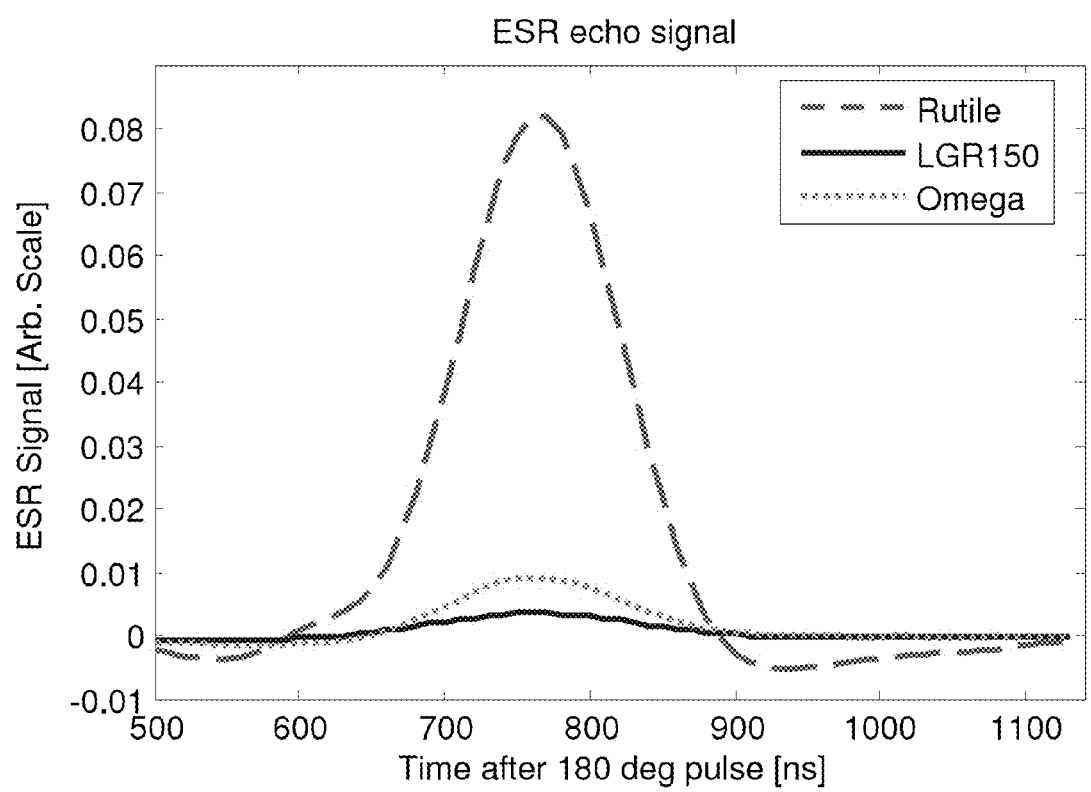
FIG. 11 shows ESR echo signal of a γ-irradiated SiO2 test sample, as measured in experiments performed according to some embodiments of the present invention.

The measured ESR echo signals acquired by the three resonators for which effective coupling were achieved are shown in FIG. 11. A standard two-pulse Hahn echo sequence was used with 90° and 180° pulse durations of 35 ns and 70 ns, respectively. Similar measurements were carried out at field offset of 100 Gauss from resonance in order to record the noise levels (results not shown). During these measurements the power required for achieving the maximum ESR signal was recorded and translated into the measured $C_p$ value (see Table 1 and the Discussion section below for more details). The measured ESR signal-to-noise-ratio, along with the sample's spin concentration and dimensions, were used to obtain the spin sensitivity for the different resonators (see Table 1 and the Discussion section below for more details).

VI. Discussion

The quality of the performed calculations compared to the experimental observation, as depicted in Table 1 will firstly be discussed. The measured $f_0$ values are in good agreement with the theoretical predictions for all three resonators. Variations of up to 5% between theoretical and measured resonant frequencies are not unexpected given the micron tolerances in the design. The calculation of the Q-factor using the finite-element model is sufficient to show the trends, providing for example a relatively high Q-factor for the Rutile resonator and low values for the surface resonators. The $V_c$ parameter is derived from the calculated magnetic fields in the resonator.

The measured power-to-field conversion factor, $C_p$, and spin sensitivity are parameters that typically characterize resonator performance. It is noted that the Rutile resonator appears to be the most sensitive resonator (FIG. 11), this is because it is the largest of all three devices, leading to the measurement of a relatively large sample volume, which is not a direct measure of its spin sensitivity. The absolute spin sensitivity, as depicted by eq. [5], relates to the minimal number of spins that can be measured when they are placed at the most sensitive point in the resonator (where $B_1$ is the largest). Spin sensitivity can be extracted from the measured ESR signal using the effective number of spins that were measured by the resonator. Since the fields in the exemplified resonators are inhomogeneous, the 3D spatial dependence of the microwave magnetic fields is considered and used for obtaining the actual number of spins contributing to the signal.

The signal of the test sample can be calculated from eq. [1], by summing up (integrating) the contributions from all individual small-volume elements $V_v$ in the sample. Due to the $B_1$ inhomogeneity, not all parts in the sample contribute the same amount of signal. In eq. [1] there are two places in which $B_1$ inhomogeneity comes into play. The first place is $C_p$, which is simply the $B_1$ field for 1 W of input power at the locations of $V_v$ used in signal integration. The second place is in the calculation of M, which is the measure of the specific magnetization in the laboratory xy plane contributing to the signal. For an echo signal, excited by non-ideal pulses with turning angles of θ and 2θ (which ideally should be the "90°" and "180°" pulses, respectively), magnetization in the laboratory xy plane is proportional to:

$$M = M_{max} \sin^3(\theta) \quad [8]$$

Eq. [8] assumes that the full ESR spectrum is excited by the MW pulses (valid for the irradiated $SiO_2$ sample employed in the experiments). The optimal turning angle θ is of course 90° but, since the fields are very inhomogeneous, most points in the sample will experience a non-optimal turning angle during the experiment. In order to account for these issues a numerical calculation of the ESR signal was performed with eqs. [1] and [8], based on the calculated $B_1$ fields throughout the sample volume. The calculation was repeated several times with the turning angle θ in the most sensitive point of the resonator (having the largest $C_p$) serving as an experimentally variable parameter (related to the power of the microwave pulses). This repeated procedure mimics the experimental set-up where the power was increased up to the level in which the best ESR signal was obtained. This optimal calculated value of the ESR signal is denoted $S^{opt}$. It was found that turning angles of θ~288° and θ~272° (at the point of largest $B_1$) provided the optimal signals for the LGR150 and Omega resonators, respectively. As for the Rutile resonator, a turning angle of θ~94° was found to be optimal. The measured $C_p$ values that appear in Table 1 are based on these simulations and the measured power that were found to provide the optimal ESR signal.

Another type of ESR signal can be calculated assuming that all spins in the sample are concentrated in the resonator's most sensitive volume element, $V_v$ (denoted $S^{max}$). The ratio between the two ($S^{opt}/S^{max}$), multiplied by the total number of spins in the sample, can be considered as the effective number of spins actually contributing to the signal. This effective number is smaller than the actual number of spins in the sample since it assumes that that all of these "effective spins" were at the point of largest $B_1$. The number of effective spins contributing to the signal is used to obtain the resonator's experimental spin sensitivity. Furthermore, since the LGR150 and LGR50 resonators were designed and operated at lower frequencies than the Omega and the Rutile devices, Table 1 lists also the "adjusted" spin sensitivity of these resonators, assuming they were operated at 17 GHz. These adjustments for the calculated and the experimental spin sensitivity values are based on eq. [5]. There is a general agreement between the calculated and experimental spin-sensitivity values.

Example 2

In the present example, a study of several types of resonator systems according to some embodiments of the present invention is described. The study was performed by the inventors of the present invention and published in Review of Scientific Instruments 82, 076105, 2011 in an article entitled "Note: High sensitivity pulsed electron spin resonance spectroscopy with induction detection".

This example presents a surface microresonator that was operated at temperatures ranging from room temperature down to 5K and showed improved measured spin sensitivity, down to $1.5 \times 10^6$ spins/√Hz for a sample of phosphorus doped $^{28}Si$ ($^{28}Si:P$). This spin sensitivity corresponds to about $2.5 \times 10^4$ spins for a reasonable one hour of averaging time, which constitutes an improvement of over two orders of magnitude compared to conventional induction detection ESR.

The pulsed ESR experimental setup is described in details in Blank et al. 2009. Briefly, it is a wide-band, home-made, 6 to 18 GHz pulsed ESR imaging spectrometer. In the present example the loop-gap surface microresonator shown in FIGS. 1C and 2C was produced by photolithography and was made of a thin (1 μm) layer of gold deposited on a $TiO_2$ single-crystal substrate (from MTI Corporation, USA). The coupling to the microwave (MW) transmission line was achieved using a microstrip line. Note that the loop inner diameter was 20 μm, which is much smaller than in FIG. 2A.

Figure 12:
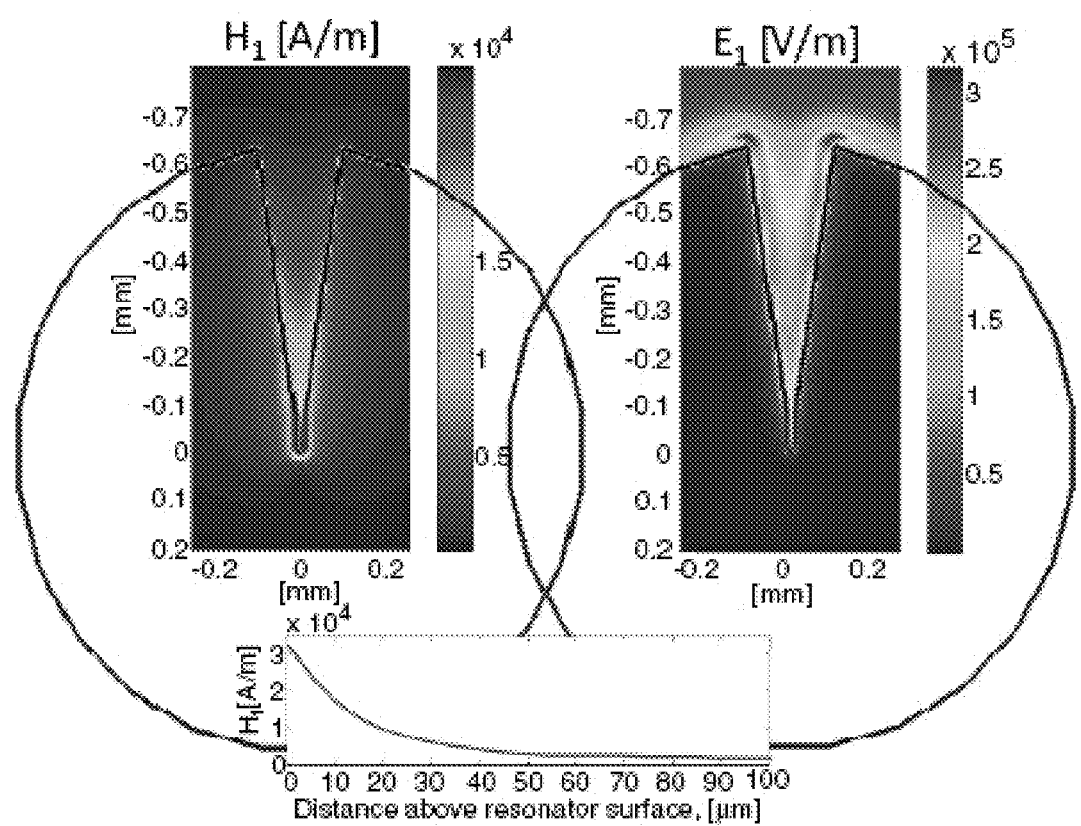
FIG. 12 shows calculated microwave magnetic- and electric-field distributions of a resonator illustrated in FIG. 2C, as calculated according to some embodiments of the present invention.

The magnetic and electric fields distributions in the surface of the resonator are shown in FIG. 12 (calculated by CST Microwave Studio). The calculated fields reveal a small effective resonator volume of only $V_c$=0.62 nL. The resonator system was embedded inside a cryogenic system (based on the Janis Research, USA, cryostat model STVP-200) that provided an operating temperature range of ~3-300 K. Variable coupling capability of the microstrip feed line via mechanical movement with respect to the resonator even under cryogenic temperatures was achieved through the use of special two-axis piezo positioners (model ANPx101 from Atocube, Germany). The resonator's quality factor was measured with a MW vector network analyzer (Agilent E8361A) and was found to be about 15 at room temperature and about 200 at 5 K, respectively. The resonance frequencies of the empty resonator were measured as 16.048 and 14.248 GHz at room temperature and 5 K, respectively (due to the increased relative permittivity of the $TiO_2$ substrate from about 165 at room temperature to about 245 at 5 K).

The experimental tests of spin sensitivity of the resonator system were carried out with three types of test samples.

A first sample was a 1-mM partially de-oxygenated water solution of a stable organic radical (deuterated trityl). The relaxation times of this sample at room temperature were found to be $T_1$=2.5 μs (measured by saturation recovery), $T_2$=910 ns (by two-pulse Hahn echo), and $T_2^*$=230 ns (by the inverse of the echo spectral width $T_2^*$=1/π$\Delta$v).

A second sample was made of thin, 150-μm fused quartz slide, which was placed in a solution of $N@C_{60}$ and $C_{60}$ mixture in $CS_2$ with a $N@C_{60}$:$C_{60}$ ratio of ~2×10$^{-4}$. The solution was left overnight in a fume hood, resulting in the evaporation of the $CS_2$ and crystallization of the solid $N@C_{60}$: $C_{60}$ on the slide's surface, creating a thin layer of solids on one side of the glass (about 10-20 μm thick, based on optical microscopy). The sample was measured in a conventional Bruker ESR spectrometer (EMX) and its signal was compared to a reference 1-μM deuterated trityl radical water solution. The results provided spin concentration of 4.7×10$^4$ spins per μm$^2$ for the $N@C_{60}$: $C_{60}$ sample. The relaxation times of this sample were measured to be $T_1$=6.8 ms, $T_2$=3.1 μs, and $T_2^*$=127 ns, at 10 K.

A third sample was made of a thin 10-μm layer of $^{28}$Si:P (~10$^{16}$ P cm$^{-3}$) with $^{28}$Si purity of more than 99.9%, placed on a high-resistivity p-type silicon substrate. At a temperature of 10 K, the measured values for $T_1$, $T_2$ and $T_2^*$ were $T_1$=1 ms, $T_2$=260 μs (assuming simple exponential decay) and $T_2^*$=0.8 μs.

The spin sensitivity of the resonator system was measured with the test samples. Representative results for the trityl sample, obtained by a simple one-pulse free-induction decay (pulse length 30 ns, MW power 1.5 W), are provided in FIG. 13A. The frequency was 16.037 GHz, the repetition rate was 70 kHz, and data were averaged over 9 seconds.

The measurements were carried out at room temperature with the de-oxygenated solution placed on the resonator and then sealed from above to maintain some de-oxygenation (in a glove box, under Ar atmosphere). The SNR in FIG. 13A is about 10,192, which for 1 sec of acquisition is about 10,192/√9≈3397. The volumetric analysis of the 3D calculated magnetic fields distribution of the resonator reveals that about 1% of the signal originates from the most sensitive region at its center, in a volume of 3000 μm$^3$. This analysis assumes that the signal in each part of the resonator is proportional to the local |$H_1$|$^2$. The number of spins in this volume were calculated based on the trityl solution concentration, resulting in about 6×10$^5$×3000=1.8×10$^9$ spins. The corresponding spin sensitivity of this measurement is about 1.8×10$^9$/(3397/100)≈5.3×10$^7$ spins/√Hz.

The measurements with the $N@C_{60}$:$C_{60}$ sample were carried out both at room temperature and cryogenic temperatures (in the 5-18 K range). Typical results for a temperature of 10K obtained by a simple two-pulse Hahn echo sequence (pulse lengths 30 and 70 ns, pulse separation 500 ns, MW power 5 mW) are shown in FIG. 13B. The frequency was 14.248 GHz, the repetition rate was 150 Hz, and the data were averaged over 21 seconds.

In this measurement, the SNR is was about 60, which for 1 sec of acquisition is about 60/√21≈13.1. The analysis of the resonator surface fields distribution reveals that about 10% of the signal originates from a surface of 750 μm$^2$ at the center of the resonator. Based on the sample calibration this surface holds about 4.7×10$^4$750≈3.5×10$^7$ spins, corresponding to spin sensitivity of about 3.5×10$^7$/(13.1/10)≈2.7×10$^7$ spins/√Hz.

Experiments with the $^{28}$Si:P sample were conducted only at cryogenic temperatures. Optimal sensitivity for this type of sample was obtained at the lowest temperature in which $T_1$≈$T_2$ (found to be ~10K). Going to lower temperatures increases the net magnetization but reduces the signal averaging capability due to rapid increase of $T_1$. The results are shown in FIG. 13C. The frequency was 13.736 GHz, the repetition rate was 1000 Hz, and the data were averaged over 8 seconds.

The results in FIG. 13C were obtained at 10 K with a Carr-Purcell-Meibum-Gill (CPMG) sequence of 100 echoes (since $T_2$>>$T_2^*$), π/2 and π pulse lengths of 30 and 70 ns, respectively, π/2–π pulse separation of 2 μs and MW power of 0.5 mW. The SNR in FIG. 3C is about 1349, which for 1 sec of acquisition is about 1349/√8≈477. As before, about 10% of the signal originates from a surface of 750 μm$^2$ at the center of the resonator. Based on the known P concentration this surface holds about 10$^5$×750≈7.5×10$^7$ spins (in this example, the entire 10-μm thickness of the sample is considered as surface). The corresponding spin sensitivity is about 7.5×10$^7$/(477/10)≈1.5×10$^6$ spins/√Hz.

Example 3

In this Example, several additional resonator systems which can be utilized according to some embodiments of the present invention are described.

Figure 14A:
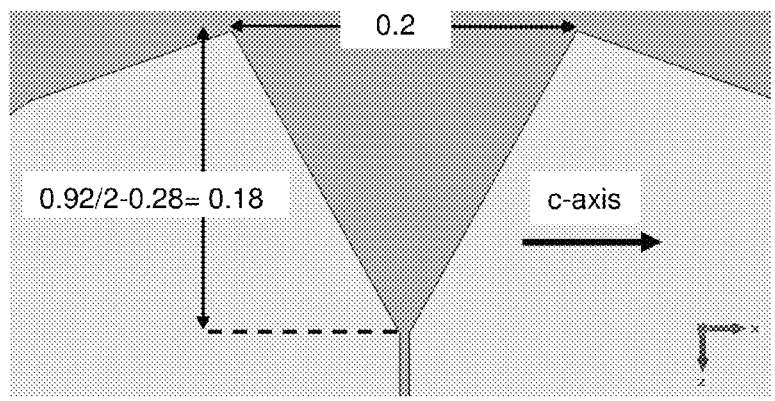
FIGS. 14A-C show exemplary dimensions for a disc resonator layer with a Y-shaped gap according to some embodiments of the present invention.

FIG. 14A shows exemplary dimensions for the disc resonator layer with a Y-shaped gap illustrated in FIG. 2D. The diameter of the disc (see 12 in FIG. 2D) is about 920 μm, and the length of fixed width part (22 in FIG. 2D) is about 280 μm. The length of the widening part (24 in FIG. 2D) is therefore about 920/2-280=180 μm. The width of the fixed width part is about 5 μm and the maximal opening of the widening part (at the periphery of the disc) is about 200 μm. The gap as a circular portion (18 in FIG. 2D), 20 μm in diameter, at the center of the disc. The resonator layer is deposited on a 0.22 mm rutile such that the c-axis is parallel to the resonator layer and perpendicular to the longitudinal axis of the gap.

The room temperature resonance of this resonator layer is about 17.365 GHz with an effective volume of 0.65 nL and the cold temperature (about 5K) resonance is about 15.05 GHz with an effective volume of about 0.22 nL. The calculations for the effective volumes were made with fine mesh of a vacuum layer 50 μm in diameter and μm in height, located 5 μm above the resonator layer. The XZ meshing was 2×2 μm$^2$ and the y meshing was 5 μm.

Figure 14B:
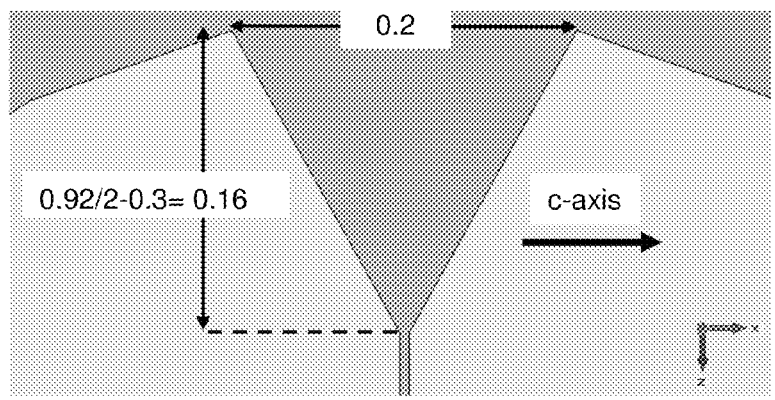

FIG. 14B shows other exemplary dimensions for the disc resonator layer with a Y-shaped gap illustrated in FIG. 2D. The diameter of the disc is about 920 μm, the length of fixed width part is about 300 μm, and the length of the widening part is therefore about 920/2-300=160 µm. The width of the fixed width part is about 10 µm and the maximal opening of the widening part is about 200 µm. The diameter of the circular portion at the center of the disc is 20 µm. The resonator layer is deposited on a 0.22 mm rutile such that the c-axis is parallel to the resonator layer and perpendicular to the longitudinal axis of the gap.

The room temperature resonance of this resonator layer is about 17.17 GHz with an effective volume of about 0.75 nL and the cold temperature (about 5K) resonance is about 14.87 GHz with an effective volume of f about 0.37 nl. The calculations for the filling factor were as described above with respect to FIG. 14A.

Figure 14C:
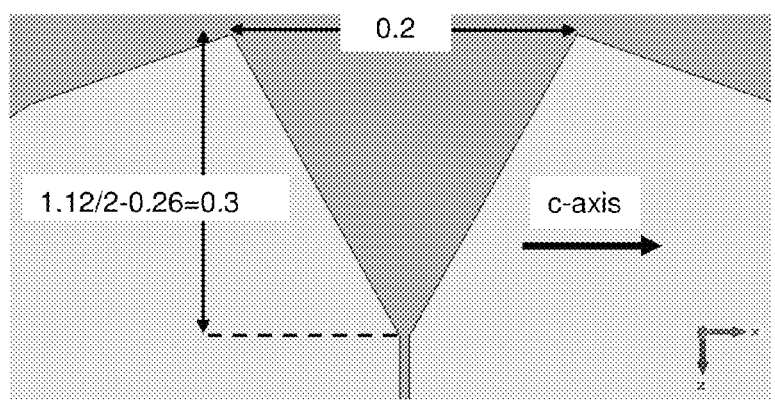

FIG. 14C shows other exemplary dimensions for the disc resonator layer with a Y-shaped gap illustrated in FIG. 2D. The diameter of the disc is about 1120 µm, the length of fixed width part is about 260 µm, and the length of the widening part is therefore about 1120/2-260=300 µm. The width of the fixed width part is about 5 µm and the maximal opening of the widening part is about 200 µm. The diameter of the circular portion at the center of the disc is 10 µm. The resonator layer is deposited on a 0.22 mm rutile such that the c-axis is parallel to the resonator layer and perpendicular to the longitudinal axis of the gap.

The room temperature resonance of this resonator layer is about 16.75 GHz with an effective volume of 0.57 nl, and the cold temperature (about 5K) resonance is about 15.28 GHz with an effective volume of about 0.23 nl The calculations for the filling factor were as described above with respect to FIG. 14A.

Another exemplary embodiment is a disc resonator layer with a Y-shaped gap having a relatively short fixed-width part, as illustrated in FIG. 2C, but with the following set of dimensions. The diameter of the disc is about 1080 µm, the length of fixed width part is about 75 µm, and the length of the widening part is about 501 µm. The width of the fixed width part is about 20 µm and the maximal opening of the widening part is about 200 µm. The resonator layer is deposited on a 0.22 mm rutile such that the -axis is parallel to the resonator layer and perpendicular to the longitudinal axis of the gap.

The room temperature resonance of this resonator layer is about 16.99 GHz with an effective volume of about 1.56 nL, and the cold temperature (about 5K) resonance is about 14.53 GHz with an effective volume of about 1.42 nL. The calculations for the filling factor were as described above with respect to FIG. 14A.

Figure 15:
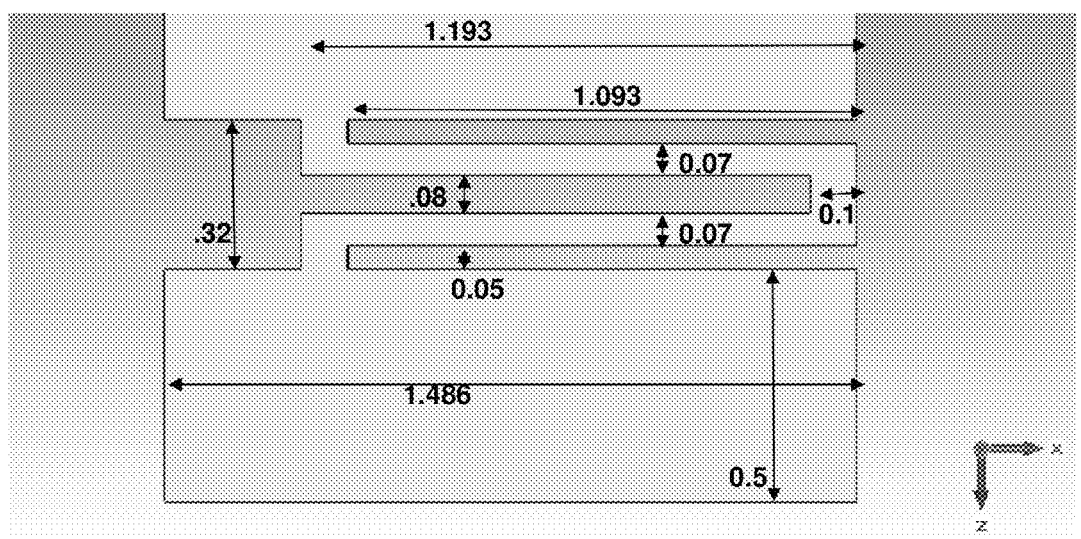
FIG. 15 shows exemplary dimensions for an interdigitated pattern, according to some embodiments of the present invention.

FIG. 15 shows exemplary dimensions for an interdigitated pattern suitable for an antenna similar to that illustrated in FIG. 3. The overall length and width of the antenna are about 6 mm and about 1.486 mm, respectively. The pattern is shaped as a straight line omega defining three interdigitated gaps, and it extends from point $z_1$ to point $z_2$ where $z_1$ is 0.5 mm from the end of the antenna and $z_2$ is 0.82 mm from the same end. Each gap has a length of 1093 µm perpendicularly to the longitudinal direction (the z axis in FIG. 15). The width of the middle gap is about 80 µm, and the width of each of the other gaps is about 50 µm. The distance between adjacent gaps along the longitudinal direction (the z direction in FIG. 15) is about 70 µm. The middle gap is offset from the other gaps by about 100 µm along the transverse direction (the x direction in FIG. 15).

Example 4

Figure 16:
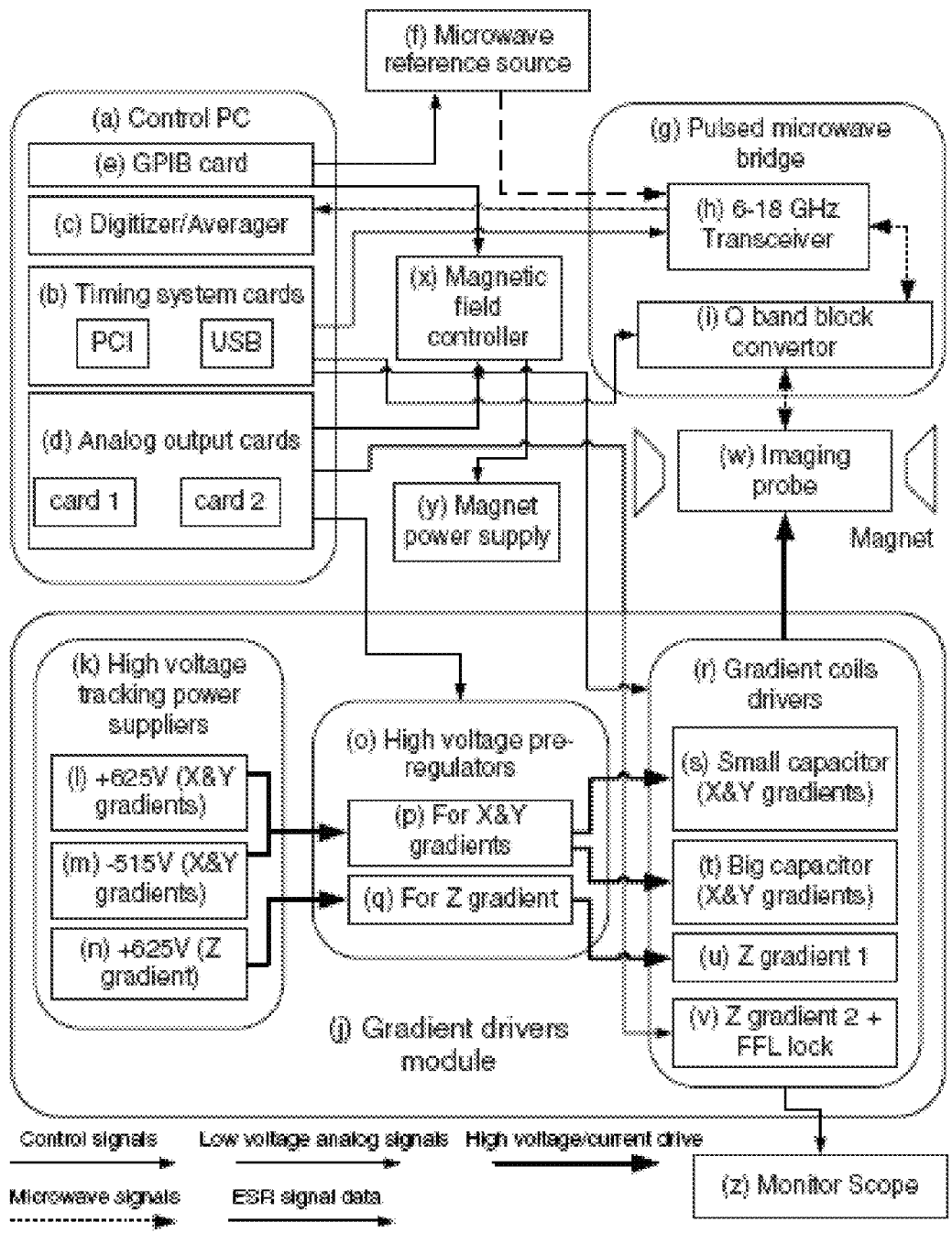
FIG. 16 is a block diagram illustrating an exemplary ESR system according to some embodiments of the present invention.

FIG. 16 is a block diagram illustrating an exemplary prototype ESR system which is in accordance with some embodiments of the present invention and which was used by the present inventors in some of the above experiments.

The system of this example is constructed from the following main modules: (a) computer (PC) which supervises the image acquisition process, e.g., through LABVIEW® (National Instruments), MATLAB® (Mathworks) and C++ (Microsoft®) software. The PC includes: (b) two timing cards—one is a PulseBlasterESRPro from SpinCore, which has 21 TTL outputs, time resolution of 2.5 ns and a minimum pulse length of 2.5 ns, and the other is PulseBlasterUSB, also from SpinCore, which has 24 TTL outputs with time resolution of 10 ns; (c) an 8 bit dualchannel PCI-format digitizer card for raw data acquisition and averaging, with a sampling rate of 500 MHz and averaging capability of up to 0.7 M waveforms/s (AP-235, Acqiris); (d) two PCI analog output cards, each having eight outputs with 16 bit resolution (PCI-6733, National Instruments); and (e) a general purpose interface bus (GPIB) control card (National Instruments).

The microwave part of the system of this example includes: (f) a microwave reference source (HP8672A) with a power output of 10 dBm in the 2-18 GHz range; (g) a homebuilt pulsed microwave bridge containing: (h) a 6-18 GHz low power transceiver and (i) a 33-36 GHz frequency block converter. The gradient drivers module (j) can include a complex array of the following sub-modules: (k) high voltage power supplies (Lambda GEN600-2.6), each with a 1.6 kW output, with voltages of +625 and −515 V [supplies (l) and (m)] and another of +625 V [supply (n)].

In addition, the system of this example includes two high-voltage preregulators, one that works up to a voltage of +625V/−515V, for the X and Y gradients (p) and the other, for the Z gradient (q), working up to +625 V. The outputs of these regulated supplies go to the gradient coils drivers' module (r). This module can contain two pulsed drivers for the X and Y coils—one with small capacitors (s) for relatively short pulses and small currents, and one with large capacitors (t) for relatively long gradient pulses and high current. A similar pulsed drive is also provided for the Z gradient coil (u), but only with positive charge voltage. In addition, this module also contains a low-current/low-voltage drive to the Z coil for supplying the latter with a constant gradient and also for supplying the field-frequency lock coil with dc current drive (v). This enables locking the local field in the probe to the resonance field of the sample, regardless of possible external fields or frequency drifts in the system.

The microwave and gradient currents go directly to a microimaging probe (w), which includes the surface resonator system of the present embodiments.

The system of this example also includes a magnetic field controller (x) (Lakeshore model 475) that stabilizes the magnetic field in the magnet (10 in. variable gap from GMW) through the current drive in the magnet power supply (y) (Walker HS-75150-3SS). A monitor scope is embedded as part of the system to examine its variety of analog pulses and digital triggers (z).

REFERENCES

[1] C. L. Degen, M. Poggio, H. J. Mamin, C. T. Rettner and D. Rugar, Proc. Natl. Acad. Sci. U.S.A., 106, 1313. (2009)
[2] D. Rugar, R. Budakian, H. J. Mamin and B. W. Chui, Nature, 430, 329. (2004)
[3] C. Durkan and M. E. Welland, Appl. Phys. Lett., 80, 458. (2002)
[4] M. Mannini, P. Messina, L. Sorace, L. Gorini, M. Fabrizioli, A. Caneschi, Y. Manassen, P. Sigalotti, P. Pittana and D. Gatteschi, Inorg. Chim. Acta, 360, 3837. (2007)

[5] Y. Manassen, R. J. Hamers, J. E. Demuth and A. J. Castellano, Phys. Rev. Lett., 62, 2531. (1989)
[6] G. Balasubramanian, I. Y. Chan, R. Kolesov, M. Al-Hmoud, J. Tisler, C. Shin, C. Kim, A. Wojcik, P. R. Hemmer, A. Krueger, T. Hanke, A. Leitenstorfer, R. Bratschitsch, F. Jelezko and J. Wrachtrup, Nature, 455, 648. (2008)
[7] J. M. Taylor, P. Cappellaro, L. Childress, L. Jiang, D. Budker, P. R. Hemmer, A. Yacoby, R. Walsworth and M. D. Lukin, Nature Physics, 4, 810. (2008)
[8] Blank, E. Suhovoy, R. Halevy, L. Shtirberg and W. Harneit, Phys. Chem. Chem. Phys., 11, 6689. (2009)
[9] K. Lips, P. Kanschat and W. Fuhs, Sol. Energy Mater., 78, 513. (2003)
[10] P. Pichler, Intrinsic point defects, impurities, and their diffusion in silicon, Springer, Wien; New York, 2004.
[11] M. Mannini, D. Rovai, L. Sorace, A. Perl, B. J. Ravoo, D. N. Reinhoudt and A. Caneschi, Inorg. Chim. Acta, 361, 3525. (2008)
[12] P. P. Borbat, A. J. Costa-Filho, K. A. Earle, J. K. Moscicki and J. H. Freed, Science, 291, 266. (2001)
[13] Blank, C. R. Dunnam, P. P. Borbat and J. H. Freed, J. Magn. Reson., 165, 116. (2003)
[14] Blank and J. H. Freed, Isr. J. Chem., 46, 423. (2006)
[15] G. A. Rinard, R. W. Quine, R. T. Song, G. R. Eaton and S. S. Eaton, J. Magn. Reson., 140, 69. (1999)
[16] P. Poole, Electron spin resonance: a comprehensive treatise on experimental techniques, Wiley, New York, 1983.
[17] M. T. Sebastian, Dielectric materials for wireless communication, Elsevier, Amsterdam; Boston, 2008.
[18] R. Narkowicz, D. Suter and I. Niemeyer, Rev. Sci. Instrum., 79. (2008)
[19] R. Narkowicz, D. Suter and R. Stonies, J. Magn. Reson., 175, 275. (2005)
[20] C. Torrezan, T. P. M. Alegre and G. Medeiros-Ribeiro, Rev. Sci. Instrum., 80. (2009)
[21] J.-S. Hong and M. J. Lancaster, Microstrip filters for RF/microwave applications, Wiley, New York, 2001.
[22] Y. T. Lee, J. S. Lim, C. S. Kim, D. Ahn and S. Nam, IEEE Microwave and Wireless Components Letters, 12, 375. (2002)
[23] J. Garcia-Garcia, J. Bonache, I. Gil, F. Martin, M. D. Velazquez-Ahumada and J. Martel, IEEE Transactions on Microwave Theory and Techniques, 54, 2628. (2006)
[24] Johansso. B, Haraldso. S, Petterss. L and O. Beckman, Rev. Sci. Instrum., 45, 1445. (1974)
[25] P. Lin, M. K. Bowman and J. R. Norris, J. Magn. Reson., 65, 369. (1985)
[26] W. J. Wallace and R. H. Silsbee, Rev. Sci. Instrum., 62, 1754. (1991)
[27] J. S. Hyde and W. Froncisz, National Electronics Conference proceedings, 1981.
[28] S. S. Eaton, G. R. Eaton and L. J. Berliner, Biomedical EPR, Kluwer Academic/Plenum Publishers, New York, 2004.
[29] M. E. Tobar, J. Krupka, E. N. Ivanov and R. A. Woode, J. Appl. Phys., 83, 1604. (1998)
[30] M. Jaworski, A. Sienkiewicz and C. P. Scholes, J. Magn. Reson., 124, 87. (1997)
[31] Blank, E. Stavitski, H. Levanon and F. Gubaydullin, Rev. Sci. Instrum., 74, 2853 (2003)
[32] Kajfez and P. Guillon, Dielectric resonators, Artech House, Dedham, M A, 1986.
[33] S. Agnello, R. Boscaino, G. Buscarino and F. M. Gelardi, J. Non-Cryst. Solids, 345-46, 505. (2004)
[34] Blank and H. Levanon, Spectrochimica Acta Part A-Molecular and Biomolecular Spectroscopy, 58, 1329. (2002)
[35] H. J. Mamin, R. Budakian, B. W. Chui and D. Rugar, Phys. Rev. Lett., 91. (2003)
[36] J. W. Stoner, D. Szymanski, S. S. Eaton, R. W. Quine, G. A. Rinard and G. R. Eaton, J. Magn. Reson., 170, 127. (2004)
[37] P. Höfer and P. Carl, Bruker Spin Report 157/158, p. 52-56 (2006)
[38] C. Ebel, K. U. Ingold, J. Michon and A. Rassat, Nouveau Journal De Chimie-New Journal of Chemistry, 9, 479. (1985)
[39] A. Blank, Y. Talmon, M. Shklyar, L. Shtirberg and W. Harneit, Chem. Phys. Lett., 465, 147. (2008)
[40] W. Hofbauer, A. Zouni, R. Bittl, J. Kern, P. Orth, F. Lendzian, P. Fromme, H. T. Witt and W. Lubitz, Proc. Natl. Acad. Sci. U.S.A., 98, 6623. (2001)
[41] M. Kondo, S. Yamasaki and A. Matsuda, J. Non-Cryst. Solids, 266, 544. (2000)
[42] M. Savla, R. P. Pandian, P. Kuppusamy and G. Agarwal, Isr. J. Chem., 48, 33. (2008)
[43] E. W. Moore, S. Lee, S. A. Hickman, S. J. Wright, L. E. Harrell, P. P. Borbat, J. H. Freed and J. A. Marohn, Proc. Natl. Acad. Sci. U.S.A., 106, 22251. (2009)
[44] W. Harneit, C. Meyer, A. Weidinger, D. Suter and J. Twamley, Physica Status Solidi B-Basic Research, 233, 453. (2002)
[45] B. E. Kane, Nature, 393, 133. (1998)
[46] J. H. Wesenberg, A. Ardavan, G. A. D. Briggs, J. J. L. Morton, R. J. Schoelkopf, D. I. Schuster and K. Molmer, Phys. Rev. Lett., 103. (2009)

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A resonator system for electron spin resonance (ESR), comprising:
   a generally planar resonator layer having a thickness of less than 1 micron deposited on a dielectric substrate, said resonator layer defining an open-loop gapped by a non-conductive gap in said layer; and
   a microwave feed, positioned opposite to said resonator layer relative to said substrate and configured for transmitting microwave to said resonator layer to concentrate a microwave magnetic field within an effective volume above said layer.

2. The system of claim 1, wherein said effective volume is less than 1 nL and the system is characterized by a quality factor of at least 10.

3. The system of claim 1, further comprising a distance adjusting unit configured for adjusting a distance between said microwave feed and said resonator layer.

4. The system of claim 1, wherein said gap has an elongated shape defining a longitudinal axis generally parallel to said layer.

5. The system of claim 4, wherein said substrate has an anisotropic crystal structure and wherein a c-axis of said crystal structure is generally parallel to said layer and generally perpendicular to said longitudinal axis.

6. The system of claim 4, wherein said substrate has an anisotropic crystal structure and wherein a c-axis of said crystal structure is generally parallel to said layer and generally parallel to said longitudinal axis.

7. The system of claim 1, wherein said resonator layer has a shape of a disc and wherein said gap is extending along a radial direction of said disc.

8. The system of claim 7, wherein said gap comprises a generally round portion at a center of said disc.

9. The system of claim 1, wherein said resonator layer has an elongated shape defining a longitudinal axis and wherein said gap is extending along said longitudinal axis.

10. The system of claim 9, wherein said elongated shape and said gap generally define a U shape.

11. The system of claim 1, wherein said gap widens towards a periphery of said resonator layer.

12. The system of claim 4, wherein said gap has a generally fixed width along said longitudinal axis.

13. The system of claim 1, wherein said gap comprises a fixed width part and a widening part.

14. The system of claim 13, wherein said widening part is an extension of said fixed width.

15. The system of claim 4, wherein said microwave feed comprises an elongated antenna generally parallel to said longitudinal axis.

16. The system of claim 15, wherein said antenna is generally planar.

17. The system of claim 16, wherein said antenna has at least one gap near an end of said antenna and generally perpendicular to said longitudinal axis.

18. The system of claim 17, wherein said at least one gap of said antenna forms an interdigitated pattern.

19. The system of claim 1, being characterized by spin sensitivity of less than $2 \times 10^7$ spins/$\sqrt{Hz}$ in a LiPc sample for 1 second of acquisition at a frequency of about 15 GHz and room temperature.

20. The system of claim 1, being characterized by spin sensitivity of less than $2 \times 10^8$ spins/$\sqrt{Hz}$ in a $SiO_2$ sample for 1 second of acquisition at a frequency of about 15 GHz and room temperature.

21. The system of claim 1, being characterized by spin sensitivity of less than $2 \times 10^6$ spins/$\sqrt{Hz}$ in a sample of phosphorus doped $^{28}Si$ for 1 second of acquisition at a frequency of about 14 GHz and temperature about 10K.

22. An ESR system, comprising;
a resonator system according to claim 1;
a controller for activating said resonator system to induce ESR signals within a sample and to receive said signal; and
a data processor configured for receiving from said controller an input indicative of said ESR signals, and providing ESR analysis responsively to said signals.

23. The system of claim 22, further comprising at least one gradient coil configured for spatially encoding said ESR signals from the sample.

24. The system of claim 23, wherein said data processor is configured for generating an image of said sample based on said ESR signals.

25. A method of inducing an electron spin resonance (ESR) signal, comprising:
using a microwave feed for transmitting microwave to a generally planar resonator layer having a thickness of less than 1 micron and defining an open-loop gapped by a non-conductive gap in said layer, such as to concentrate, with a quality factor of at least 100, a magnetic field within an effective volume of less than 1 nL in a sample above said layer.

26. The method of claim 25, further comprising receiving said signal using said resonator layer, and performing ESR analysis responsively to said signal.

27. The method of claim 26, wherein said ESR analysis comprises imaging.

28. The method of claim 26, wherein said sample is selected from the group consisting of a surface or sub-surface of a semiconductor structure, a paramagnetic monolayer, a biological sample, and a spin-limited sample.

29. The method of claim 26, further comprising varying a distance between said microwave feed and said resonator layer.

30. A resonator system for electron spin resonance (ESR), comprising a generally planar resonator layer and a microwave feed configured for transmitting microwave to said resonator layer, such as to concentrate, with a quality factor of at least 10, a magnetic field within an effective volume of less than 1 nL above said layer.

* * * * *